US012562449B2

(12) United States Patent
Rolland

(10) Patent No.: US 12,562,449 B2
(45) Date of Patent: Feb. 24, 2026

(54) MAST INFRASTRUCTURE ELEMENT AND SUPPORT MODULE

(71) Applicant: STATIONS-E, Boussy-Saint-Antoine (FR)

(72) Inventor: Alain Rolland, Boussy-Saint-Antoine (FR)

(73) Assignee: STATIONS-E, Boussy-Saint-Antoine (FR)

( * ) Notice: Subject to any disclaimer, the term of this patent is extended or adjusted under 35 U.S.C. 154(b) by 33 days.

(21) Appl. No.: 18/270,174

(22) PCT Filed: Dec. 24, 2021

(86) PCT No.: PCT/EP2021/087631
§ 371 (c)(1),
(2) Date: Jun. 28, 2023

(87) PCT Pub. No.: WO2022/144321
PCT Pub. Date: Jul. 7, 2022

(65) Prior Publication Data
US 2024/0106102 A1     Mar. 28, 2024

(30) Foreign Application Priority Data

Dec. 29, 2020   (FR) ........................................ 2014207
Dec. 29, 2020   (FR) ........................................ 2014210
Dec. 29, 2020   (FR) ........................................ 2014211

(51) Int. Cl.
*H01Q 1/12*       (2006.01)
*E04H 12/08*      (2006.01)
(Continued)

(52) U.S. Cl.
CPC ....... *H01Q 1/1242* (2013.01); *E04H 12/2261* (2013.01); *H05K 7/186* (2013.01); *E04H 12/08* (2013.01)

(58) Field of Classification Search
CPC .. H01Q 1/1242; E04H 12/2261; E04H 12/08; E04H 5/02; H05K 7/186; H05K 5/0226
See application file for complete search history.

(56) References Cited

U.S. PATENT DOCUMENTS 4,899,500 A * 2/1990  Miller ..................... E04H 12/10
                                                           52/146
5,570,546 A * 11/1996 Butterworth ............ E04H 12/34
                                                           343/890
(Continued)

FOREIGN PATENT DOCUMENTS

DE         20218801 U1 * 4/2003 ............. E04H 12/20
FR         2947292 A1 * 12/2010 ........... H01Q 1/1242
(Continued)

OTHER PUBLICATIONS

International Search Report dated Apr. 6, 2022.

*Primary Examiner* — Rodney Mintz
(74) *Attorney, Agent, or Firm* — IPSILON USA, LLP

(57) ABSTRACT
Mast infrastructure element and support module. Disclosed is an infrastructure element (1) including a mast (2) capable of receiving at least one telecommunication antenna (20), and at least one support module (3) which is closed at the top and capable of receiving electrical equipment (E) within it permanently, the mast (2) being fastened onto the support module (3) without passing through it vertically, and at least one non-supporting accessory module (4,5) capable of receiving electrical equipment (E), the accessory module (4,5) being joined laterally to the support module (3).

9 Claims, 30 Drawing Sheets

(51) Int. Cl.
    *E04H 12/22*       (2006.01)
    *H05K 7/18*       (2006.01)

(56)           References Cited

U.S. PATENT DOCUMENTS

| | | | | |
|---|---|---|---|---|
| 5,904,004 A * | 5/1999 | Hill | ........................ | E04H 12/10 |
| | | | | 343/890 |
| 5,941,036 A * | 8/1999 | Hill | .................... | E04H 12/2261 |
| | | | | 52/651.07 |
| 6,131,349 A | 10/2000 | Hill | | |
| 9,238,921 B2 * | 1/2016 | Gupta | .................... | E04H 12/22 |
| 10,240,339 B1 * | 3/2019 | Dominguez | ........ | E04B 1/34869 |
| 10,843,907 B2 * | 11/2020 | Lagerweij | ............. | E04H 12/342 |
| 10,957,967 B2 * | 3/2021 | Smith | .................... | B61L 3/126 |
| 2005/0183363 A1 | 8/2005 | Silber | | |
| 2012/0068039 A1 * | 3/2012 | Erich | ................. | E04H 12/2238 |
| | | | | 248/519 |
| 2014/0237908 A1 * | 8/2014 | Gupta | ................. | H01Q 1/1242 |
| | | | | 52/745.18 |
| 2014/0237909 A1 * | 8/2014 | Gupta | ................. | H01Q 1/1242 |
| | | | | 52/745.17 |
| 2023/0378633 A1 * | 11/2023 | Ribiere | ................... | E04H 12/08 |

FOREIGN PATENT DOCUMENTS

| | | | | |
|---|---|---|---|---|
| GB | 2358030 | 7/2001 | | |
| KR | 20210008291 A * | 1/2021 | ............. | H01R 13/04 |
| WO | WO-9839537 A1 * | 9/1998 | ............. | E04H 12/10 |
| WO | 02056411 | 7/2002 | | |
| WO | WO-03080965 A1 * | 10/2003 | ........ | E04B 1/34823 |
| WO | WO-2010098653 A2 * | 9/2010 | .............. | H01Q 1/42 |

* cited by examiner

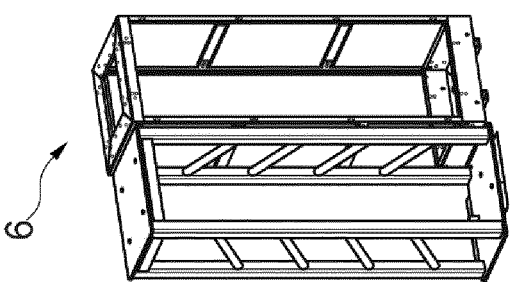
6
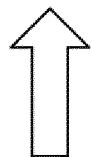
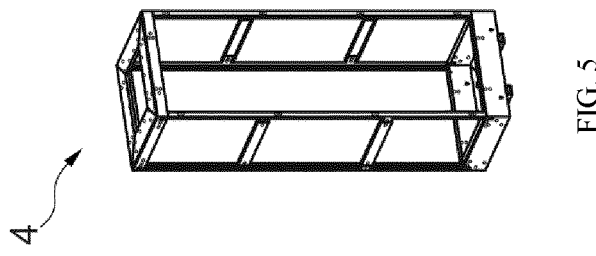
4
FIG. 5
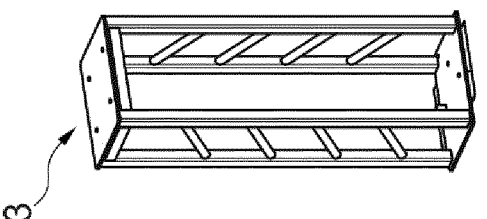
3

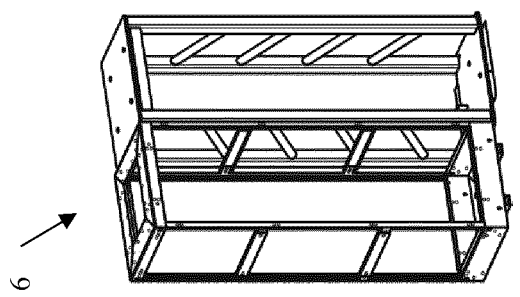
6
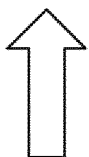
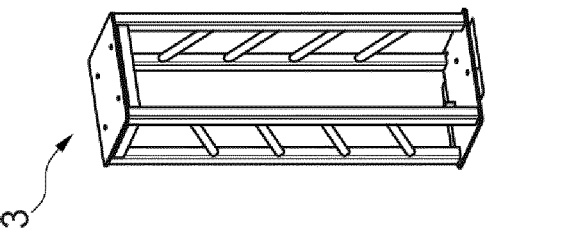
3
FIG. 6
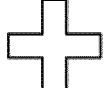
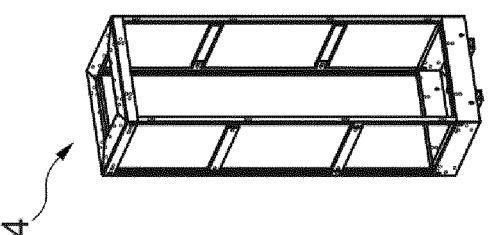
4

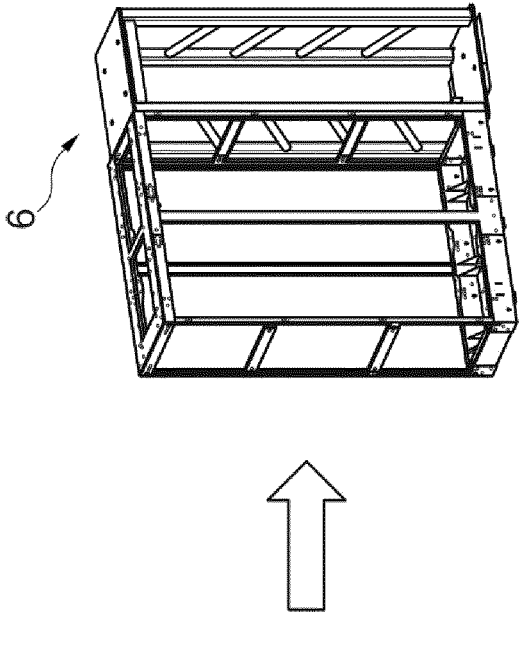
6
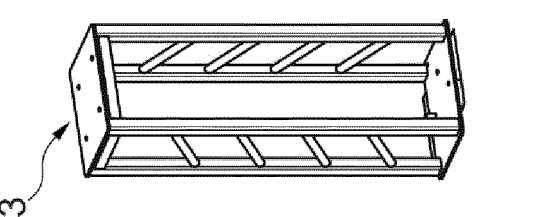
3
FIG. 7
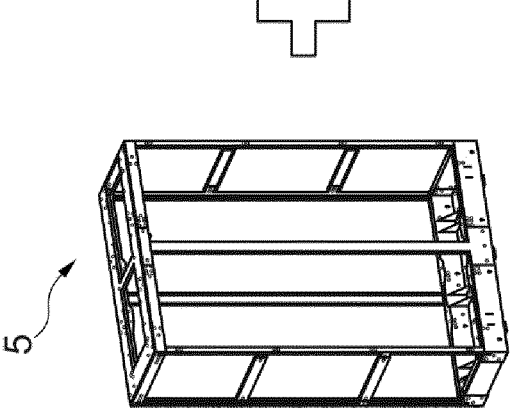
5

10

130

120

121

120

10

130

120

MAST INFRASTRUCTURE ELEMENT AND SUPPORT MODULE

RELATED APPLICATION

This application is a National Phase of PCT/EP2021/087631 filed on Dec. 24, 2021, which claims the benefit of priority from French Patent Application Nos. 20 14207, 20 14210, and 20 14211, all of which were filed on Dec. 29, 2020, the entirety of which are incorporated by reference.

TECHNICAL FIELD

The present invention concerns telecommunication, electric vehicle charging and/or environmental parameter measurement and/or CCTV infrastructure elements.

PRIOR ART

The antennas of telecommunication networks are conventionally carried by masts fixed directly to the ground, connected to a concrete block. The dimensions and properties of the block are constrained by the characteristics of the mast, its exposure to atmospheric conditions, and the conditions necessary for correct functioning of the equipment installed on the mast. For example, a mast receiving radio antenna type telecommunication equipment has a relatively severe limit on maximum depointing, of the order of 1°, which imposes constraints both on the mast and on the block, to which forces are transmitted at the foot of the mast without being distributed over the whole of the block.

Moreover, it is often necessary to add to a mast directly connected to a concrete block a lateral enclosure close to its base to pass cables therein or to insert equipment linked to the purpose for the mast. This enclosure weakens the mast and necessitates the installation of compensating reinforcements, which are relatively costly and complex to produce.

Moreover, a mast connected directly to the ground has the disadvantage of significantly limiting the space for and the possibilities of implementation of the equipment in the vicinity of the mast. Moreover, the placement of the mast is fixed at the time of construction, whatever the subsequent requirements, making a change of configuration difficult if not impossible.

It is moreover known for a kiosk type urban street furniture element to receive electrical equipment. These elements are generally equipped with fan type active cooling means in order to prevent deterioration thereof as a result of overheating problems, in particular because of exposure to the sun. Adding fans increases the electrical energy consumption and makes the street furniture element relatively noisy. Moreover, the presence of fans increases the probability of faults and intervention on site.

Finally, the infrastructure elements are generally situated in public places, and are exposed to a risk of vandalism and/or of theft of the equipment that they enclose.

STATEMENT OF INVENTION

The invention aims to remedy some or all of the above problems and in particular to improve further the infrastructure elements, more particularly but not exclusively those including a mast, in order to facilitate their installation, to improve their cooling and/or to strengthen their resistance to forced entry.

SUMMARY OF THE INVENTION

Infrastructure Element with Mast and Support Module

In a first of its aspects the invention has for object an infrastructure element including:

- a mast able to receive at least one telecommunication antenna, and
- at least one support module closed at the top and able to receive electrical equipment internally and permanently, the mast being fixed to the support module without passing vertically through it.

Thanks to the invention the mast is no longer connected directly to the concrete block, which has advantages.

Best of all, compared to a solution in which the mast passes through the module in which the electrical equipment is housed the invention enables a saving of space to receive more equipment or to optimize the space inside the module in order to limit its footprint.

Moreover, the electric cables enter the module more simply, without the aforementioned enclosure, which makes it possible to simplify the structure of the mast and avoids having to provide reinforcements linked to the presence of the enclosure.

Then, the height of the mast is reduced because of the benefit of that of the support module, which makes it possible to reduce its weight and its manufacturing cost.

Finally, the presence of the support module simplifies the production of the concrete block because the forces are distributed more widely because the module has a wider seating on the ground than the mast and moreover the connection between the mast and the support module can easily be produced in such a manner as to enable adjustment of the verticality of the mast.

Modular Assembly

The support module may have any shape adapted to support the mast and to receive the electrical equipment necessary for the operation of the equipment carried by the mast.

The support module preferably includes an arrangement that renders it compatible with assembly to other modules to form a modular assembly.

The support module may therefore have a parallelepipedal general shape and include a framework with four support columns, in particular made of metal. The support columns can rest on a base itself resting on a footing fixed to the ground, for example one or more metal profiled members.

The support module may include at least one vertical enclosure panel, preferably made of metal. The support module may preferably include at least one door with dimensions substantially identical to those of the enclosure panel, the door being preferably made of metal. By producing the door and the enclosure panels with substantially identical dimensions it is possible to have the benefit of an economy of scale in their production, the door preferably being produced by joining to the structure of the enclosure panel diverse additional components such as a lock and hinges for example.

The infrastructure element may include at least one non-supporting accessory module able to receive electrical equipment, the accessory module being assembled laterally to the support module. The support module and said at least one accessory module are preferably assembled by bolting them together.

The support module and said at least one accessory module may have a continuity of front panel in the assembly thereof, the modules being in particular of the same height.

This gives the assembly the appearance of a unitary kiosk and preserves the esthetic of the assembly.

The modules that are assembled may be single or double. By "double module" must be understood a module with substantially twice the width of a single module. The modules that are assembled may moreover include an apertured upper wall, in particular to enable circulation of air.

The support module is preferably a single module and the mast is then advantageously centered on the panel that closes the support module at the top.

When the infrastructure element includes at least two modules at least one of the accessory modules may be a module having dimensions different from those of the support module, being in particular a double module having a width substantially twice that of the support module.

Generally speaking, the infrastructure element may include a lateral assembly of a support module with one or more accessory modules, the assembly being chosen from: a double module assembled on one side of the support module, a single module assembled on one side of the support module, a double module and a single module assembled on respective opposite sides of the support module, among other possibilities.

The support module and said at least one accessory module may each define an internal volume able to receive electrical equipment, the internal volumes of two modules assembled side-by-side communicating with each other. The module or modules may include vertical rails forming a rack, enabling equipment to be fixed at diverse heights inside the modules.

Said at least one accessory module and said support module preferably each include at least one enclosure panel, those panels being identical. This therefore limits the number of different components used to produce the infrastructure element.

Said at least one accessory module may include at least one door, in particular two doors for the double module, this door or doors being substantially identical to the door of the support module. The doors are for example the same except for the lock, as described in detail later.

The support module may include a support plate onto which the mast is fixed, the seating of this plate being adjustable relative to the rest of the support module. For example, the plate is fixed to the upper panel of the support module by bolts bearing nuts adjustment of the position of which on the bolts enables adjustment of the inclination of the plate relative to the deck.

The support module and/or said at least one accessory module may be pre-equipped with ducts, gutters, rails, electrical cable guides or the like. This can facilitate installation of the element and its equipment and thus minimize the disturbance caused by the works.

The modules preferably do not include any glazing.

Mast

The mast may have a height between 4 and 10 meters and a section with a diameter between 80 mm and 350 mm.

The mast is preferably made of metal. It may be cylindrical, in particular of circular section, or conical.

The mast may carry diverse equipment in addition to the telecommunication antenna at the top, for example lateral microwave beam antennas, sensors or cameras, as well as one or more lamps for lighting the element or its environment.

The antenna may be accommodated in a shroud.

Module Equipment

The aforementioned accessory module or modules and/or the support module may receive equipment fixed into electrical cabinets or racks, preferably 19-inch cabinets, present inside the module or modules.

These cabinets may be pre-equipped before integration into the connecting structure. The equipment received in the support module and/or in said at least one accessory module or fixed to the mast may:

have telecommunication functionalities, in particular being radio modules, servers, data storage equipment, the equipment being adapted to be connected to the antenna carried by the mast by one or more cables, and/or have electrical power supply functionalities, for example for charging batteries, and/or be video servers or cameras, lighting, connected racks, GPS antennas or other location systems and/or sensors suitable for urban use, in particular noise, light, heat, UV or pollution sensors.

The cabinets or racks may be fixed to the modules at the required height thanks to the presence of vertical rails forming a rack that forms part of the frame of the modules.

Roof

The infrastructure element preferably includes a roof covering at least part of the support module or all or part of the modular assembly.

This roof provides additional protection of the underlying module or modules, in particular from the sun or inclement weather, and can enable creation of cooling air passages.

The support module including a deck, the roof is preferably supported at a distance from that deck. This therefore provides a possibility of circulation of air between the two.

The roof is preferably modular, comprising a plurality of sections assembled end-to-end, one of them including an opening for the mast to pass through. This kind of modular construction of the roof allows interchanging of the sections constituting the roof to adapt the configuration of the roof to that of the underlying modules and in particular the position of the mast in the modular assembly. The section including the opening for the mast may include a removable part that is removed to enable the placing of this section on the mast already placed on the support module, and replaced afterwards. The opening for the mast to pass through therefore has a closed contour once the roof has been fitted, which contributes to the stiffness of the roof and to the overall esthetic.

The roof is preferably connected to the support module and/or to said at least one accessory module by a support, in particular of rectangular shape, defining an opening that is longer that it is wide in such a manner as to enable at least two configurations of arrangement of the roof relative to the modular assembly. These configurations differ in the location within the roof of the section including the opening for the mast. Moreover, it is easy to extend the roof by disposing a greater number of sections end-to-end.

The roof preferably has a rim on at least one side of the support module and/or of at least one accessory module assembled to the support module. This therefore forms a kind of awning for further protection of the underlying module or modules from the sun or inclement weather. A terminal separate from the modules can equally be sheltered from rain by this rim of the roof, this terminal including a user interface, being for example a terminal for fast charging an electric vehicle.

Concrete Support Block

The infrastructure element may include a concrete block onto which at least the support module is fixed.

The invention further has for object, independently of or in combination with the foregoing, a support module as such, including four support columns fixed to a base and held in the upper part by an upper panel which includes means for fixing a support plate for a mast. The support columns are preferably joined on at least two sides of the module, preferably on the lateral sides, by bracing struts. A module of this kind may carry at least one enclosure panel and a door based on the same double-wall structure.

The invention further has for object, independently of or in combination with the foregoing, a single module as such, including four vertical rails forming a rack fixed onto a box section in the lower part and retained in the upper part by a retaining frame, the box section and the retaining frame preferably being provided on at least two of their sides, in particular their lateral sides, with openings enabling locking linkages of a door of the module to pass through.

The invention further has for object, independently of or in combination with the foregoing, a double module as such, including four vertical rails forming a rack fixed onto a box section in the lower part and retained in the upper part by a retaining frame, the longer sides of the retaining frame preferably being connected by a central connecting bridge. The double module preferably includes intermediate uprights at the front and at the rear onto which rails forming a rack are fixed.

Infrastructure Element with Improved Passive Ventilation

The invention further has for object, independently of or in combination with the foregoing, an infrastructure element including at least one module intended to receive electrical equipment, in particular a support or accessory module as defined above, that module including a framework and, fixed to the framework, at least one double-wall vertical metal enclosure panel, that enclosure panel including:

an interior wall, an exterior wall defining with the interior wall an air knife, at least one opening in the lower part and at least one opening in the upper part enabling circulation of air between said openings, between the interior and exterior walls.

In accordance with this aspect of the invention the infrastructure element may optionally include a mast and optionally include a support module.

The panel may include at least one internal reinforcement disposed between the interior and exterior walls, in particular a vertical reinforcement.

The infrastructure element in accordance with this second aspect of the invention has the advantage of enabling passive ventilation to reduce the temperature to which the electrical equipment present inside the element is liable to be exposed, in particular because of the effect of heat from the sun.

This reduces the need to provide forced ventilation of the interior space of the modules to cool the equipment, and also reduces the consumption of electrical energy and the emission of operating noise.

The panel is preferably of substantially rectangular shape with a height between 1.90 and 2.10 m for example.

The panel may be fixed to the framework of the associated module by being bolted on top, but alternatively the fixing is effected otherwise, for example with the aid of rivets or by welding.

The two walls of the panel are preferably made from metal plate having a thickness greater than or equal to 1.0 mm, in particular 1.5 mm, in particular between 1 and 3 mm. The metal is preferably steel.

The two walls of the panel are preferably assembled after cutting the metal plate, being welded together. Metal plates of different thickness may be used, with a smaller thickness for the interior wall, for example 1.5 mm for the interior wall and 2 mm for the exterior wall. Alternatively 1.5 mm metal plate is used for the exterior wall and 1 mm metal plate is used for the interior wall, or 1.5 mm metal plate is used for the interior wall and for the exterior wall.

The panel preferably includes an upper horizontal grille defining said at least one opening in the upper part. The panel may include a lower horizontal grille defining said at least one opening in the lower part. The upper horizontal grille and/or the lower horizontal grille are preferably in one piece with at least one of the exterior wall or interior wall of the panel.

The module being closed at the top by a deck, the latter can overlie said at least one vertical panel, preferably with a clearance allowing the circulation of air, the end of the deck preferably being situated in vertical alignment with the exterior face of the vertical panel.

As mentioned above the infrastructure element advantageously includes a roof covering at least a part of the module and supported at a distance from its deck thanks to a support defining a central opening, that support having apertured vertical walls in such a manner as to allow air to circulate.

The panel may optionally be provided with display means, in particular a screen. Each door or panel may equally be replaced by a display screen, subject to providing sufficient ventilation.

The infrastructure element may include at least one second module intended to receive electrical equipment, that second module being assembled laterally to the first module. The second module may include at least one enclosure panel identical to that of the first module. The modular assembly can therefore include identical rear enclosure panels, identical lateral panels, and one or more doors made from the same panels, which enables the benefit of an economy of scale in the production of the panels.

The invention further has for object, independently of or in combination with the foregoing, an enclosure panel as such, including an interior wall and an exterior wall defining an air knife with the interior wall, the interior and exterior walls being in particular assembled after production thereof, the panel including cut-outs to receive hinges, in particular four in number, and reliefs for positioning said hinges. The cut-outs to receive the hinges are formed on a return of the exterior wall. The reliefs for positioning the hinges may be formed by extensions of the interior wall. The interior wall may have raised lateral edges that define a plane surface parallel to the interior surface of the facing exterior wall. The depth of the step formed by each lateral edge substantially defines the thickness of the air knife between the interior wall and the exterior wall.

Infrastructure Element with Enhanced Safety

In accordance with another of its aspects, independently of or in combination with the foregoing, the invention further has for object an infrastructure element including at least one first module, in particular a support or accessory module as defined above, intended to receive electrical equipment, that first module including a frame and at least one first door connected to the frame on one vertical side by hinges, the door including a metal exterior wall defining the principal face of the door and having along said side a return directed toward the frame and extending at a small distance from the latter when the door is closed, each hinge including:

a fixed knuckle at least one node of which is connected by a connection to the frame, in particular a U-shaped connection including a flange extending parallel to the frame, a mobile knuckle connected to the door, the return of the door including a notch in which said connection engages when the door is in the open position.

By "short distance" must be understood a gap of less than 2 mm, preferably 1 mm or less.

The infrastructure element in accordance with this aspect of the invention has increased resistance to vandalism, thanks to the small clearance that exists between the door and the frame in the closed position, which prevents easy introduction between the two of a tool such as a crowbar. Mounting the door in this way also makes it possible to limit the clearance from the adjacent door, if any, thanks to the fact that the rotation axis of the hinge is close to the edge formed at the junction of the aforementioned return and the exterior wall of the door.

The infrastructure element in accordance with this third aspect may optionally include a mast and the first module may optionally be a support module. Likewise, the infrastructure element, in particular the first module, may optionally include an enclosure panel in accordance with the second aspect of the invention.

Said connection may include an angle-iron having a flange fixed to the frame, preferably by bolts, and another flange fixed to the fixed knuckle, preferably by rivets.

The door may include an interior wall, in particular an interior wall forming with the exterior wall an air knife in accordance with the second aspect of the invention. An angle-iron may be fixed to the interior wall of the door and provided with a seal pressed against the frame when the door is closed.

The interior wall of the door preferably includes positioning flanges the distance between which corresponds to the length of the mobile knuckle. These flanges serve as markers enabling fixing of the mobile knuckle on the door without having to measure.

When the infrastructure element includes at least one second module assembled laterally to the first module and at least one second door on that second module, that second door may have no visible lock. This therefore reduces the number of locks exposed to acts of vandalism.

The infrastructure element may include top and bottom linkages for locking the second door that can be actuated from the first module once the first door is open to lock or unlock the second door, or even one or more other doors.

Each locking linkage may include a link guided in horizontal sliding through a succession of guides and carrying at least one locking tongue optionally able to be engaged depending on the position of the link in at least one corresponding housing of a lug carried by the second door, and preferably includes a lever connected to and for actuating the link. The infrastructure element may include a blocking bar removably received in openings of the frame, arranged in such a manner as to block opening movement of the lever when in place on the frame.

The infrastructure element may include at least one module assembled to the first module, in particular a double module, this or these two additional modules having at least one door with no visible lock. For example, the first module is assembled to a double module including two doors disposed side-by-side and each having no visible lock. The links may include a plurality of sections assembled one after the other. A construction of this kind facilitates associating modules by choosing the number of sections assembled in this way as a function of the number or the dimensions of the modules disposed side-by-side.

A link section preferably passes through at least one of the openings in a lateral face of a module. One end of the link section preferably projecting significantly from the opening. The assembly of at least two consecutive link sections may be effected with a joining piece connecting the end projecting from the opening to another link section of an adjacent module.

The door or doors with no apparent exterior lock may include a lock that can be actuated only from the interior of the element, in particular a slam lock preferably situated substantially at half-height on the door.

The invention further has for object a method of opening an infrastructure element in accordance with this third aspect of the invention, including a door having a lock visible from the outside on a first module and a door with no visible lock on a second module assembled to the first module, the method including the steps consisting in:

using a key, unlocking and opening the door having the lock visible from the outside, unlocking at least the door including no lock visible from the outside by acting on the top and bottom linkages from inside the element.

BRIEF DESCRIPTION OF THE DRAWINGS

The invention may be better understood on reading the following detailed description of non-limiting embodiments thereof and examining the appended drawings, in which:

FIG. 5 is a partial and schematic representation of an example of an assembly comprising a support module and a double accessory module, FIG. 6 is a partial and schematic representation of another example of an assembly comprising a support module and a double accessory module, FIG. 7 is a partial and schematic representation of an example of an assembly comprising a support module and a single accessory module.

DETAILED DESCRIPTION

Figure 1:
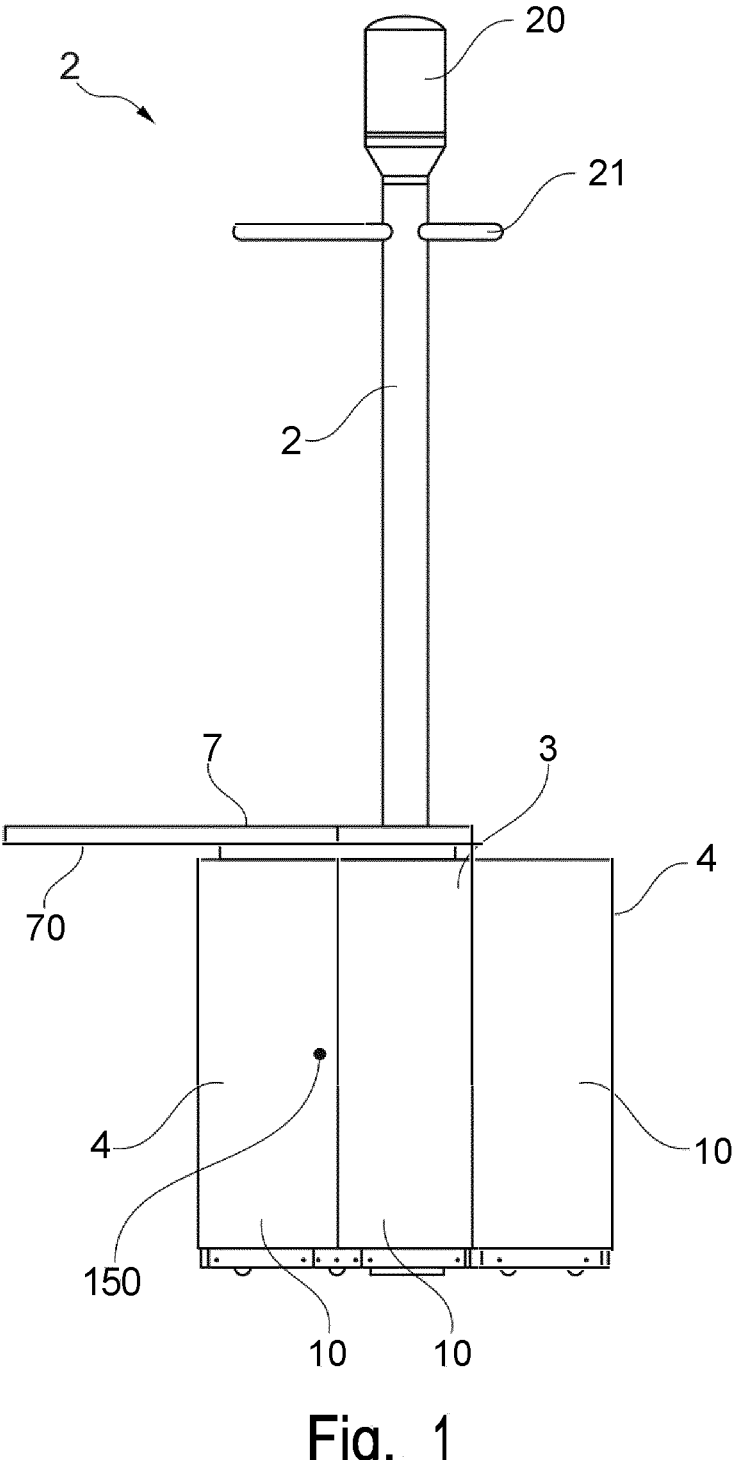
FIG. 1 is a schematic and partial representation of an example of an infrastructure element according to the invention.

There has been depicted in FIG. 1 an example of an infrastructure element 1 (also known as kiosk) according to the invention. In this example the element 1 includes a mast 2 carried by a support module 3 onto respective opposite sides of which are assembled two accessory modules 4 with substantially identical dimensions to those of the support module 3. The modules 3 and 4 house electrical equipment E, one example of the arrangement of which can be seen in FIG. 10.

As shown, the mast 2 may be of cylindrical or conical general shape and its height is for example between 4 and 10 m.

The mast 2 carries at its summit a telecommunication network antenna contained in a protecting shroud 20 and possibly other equipment such as CCTV cameras or sensors. A boom 21 may additionally be fixed to the mast 2 in order to receive additional equipment, for example lighting equipment. The antenna is also able to receive laterally microwave beam antennas.

The antenna is for example intended for a telecommunication network for mobile telephones, for example a so-called 4G, 5G or later generation network.

In accordance with the first aspect of the invention the mast 2 does not pass vertically through the support module 3 onto which it is fixed.

Each of the modules 3 or 4 includes a preferably metal frame 12 and lateral or rear vertical enclosure panels 9 as well as a door 10.

Figure 2:
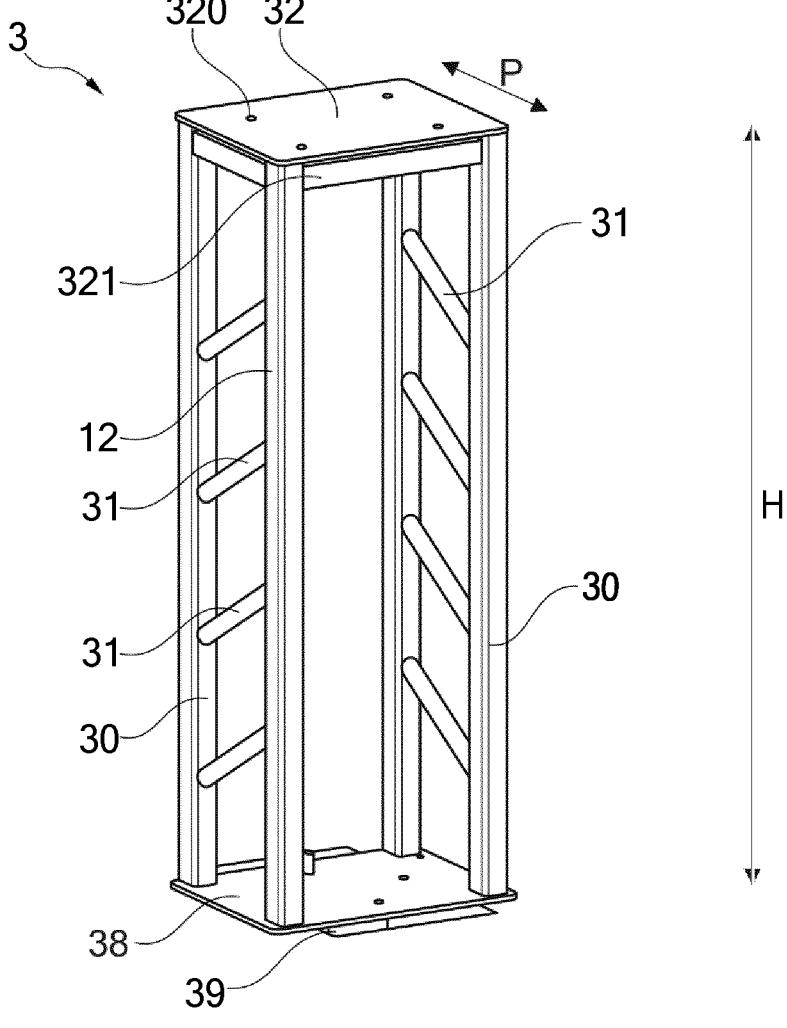
FIG. 2 is a schematic and partial representation of an example of a support module according to the invention.

As depicted in FIG. 2 the support module 3 is preferably of parallelepipedal general shape and its frame 12 includes for example a framework comprising four preferably metal support columns 30.

Figure 32:
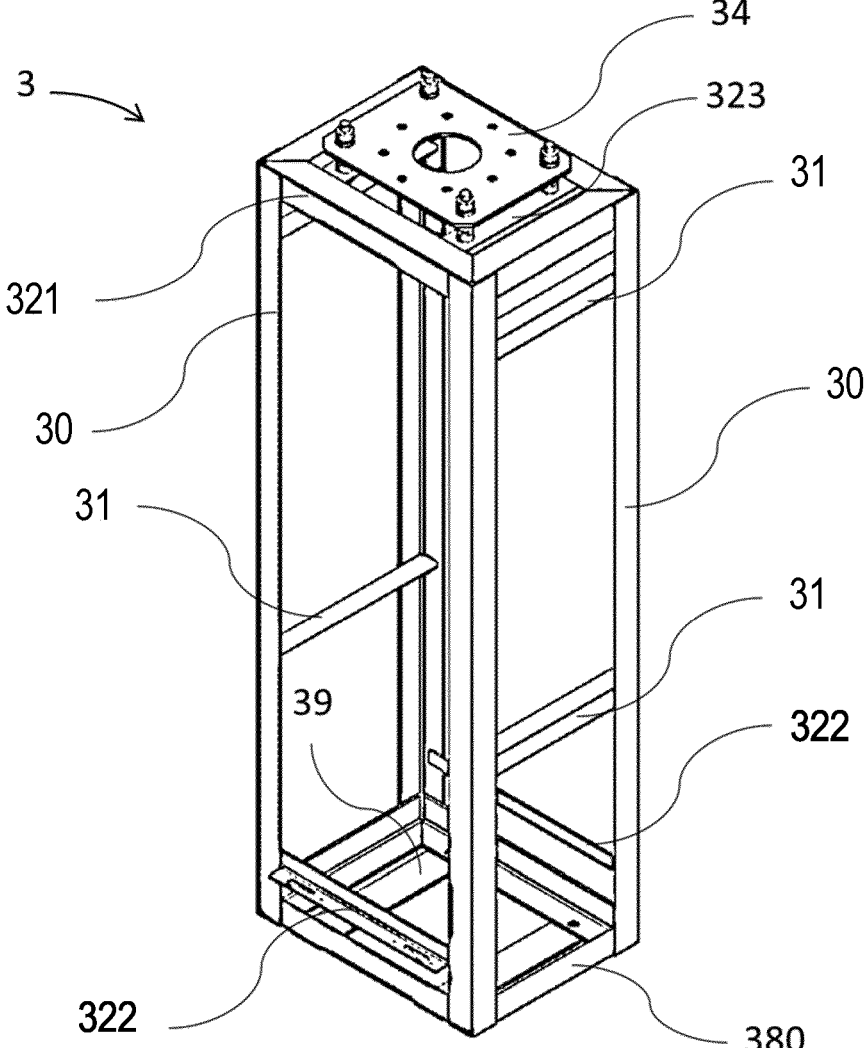
FIG. 32 is a schematic and partial representation of a variant of the support module from FIG. 2.

The support columns 30 may be of rectangular section, as in the example considered here, or in the form of angle-irons, as depicted in the FIG. 32 variant.

The support columns 30 may be fixed at the bottom to a base 38 resting on a footing 39 on a concrete block, this footing consisting for example of one or more steel profiled members flush with the surface of the block.

Alternatively, as depicted in FIG. 32, angle-irons 380 resting on the footing 39 may serve as spacers between the support columns 30 at the base of the module 3. A support module 3 has a structure enabling it to withstand and to distribute the stresses exerted on the mast that are transmitted to it and the columns 30 are preferably joined on at least two sides of the module, preferably on the lateral sides, by bracing struts 31, as can be seen in FIG. 2. These struts 31 are for example oriented toward the front and toward the top on one side and toward the front and toward the bottom on the other side, which can improve stiffness.

Alternatively, the struts 31 are horizontal, which simplifies manufacture. In particular, as depicted in FIG. 32 the support module 3 may include only two horizontal struts 31 on each of its lateral faces. In particular, the frame may include on each lateral face a lower strut 31 preferably disposed at about one-third of the height from the bottom (in particular between ¼ and ½ of the height) and an upper strut 31 disposed at a small distance from the upper ends of the columns 30 (in particular at less than ¼ of the height from the upper ends), in such a manner as to be able to support optimally the mast when it is exposed to relatively high wind loads.

The struts 31 are for example angle-irons approximately 5 to 6 mm thick.

A structure of this kind has the benefits of a low manufacturing cost and ease of use, since the small number of bracing struts 31 enables space to be freed for installing the equipment inside the infrastructure element 1.

In the FIG. 2 example considered here the support module 3 moreover includes in its upper part 32 reinforcements 321 that serve as spacers between the support columns and four holes 320 that receive fixing means of the mast 2, as described in detail later.

In the FIG. 32 variant the support module 3 further includes reinforcements 322 on its front and rear faces in its lower part (in particular in the bottom quarter) that contribute to distributing the stresses transmitted from the mast to the module. These reinforcements are preferably horizontal and each of them interconnects two columns 30.

The upper part 32 of the support module 3 enables the mast 2 to be fixed to the support module, as described later. It may be a deck covering the support module 3 as depicted in FIG. 2 or a set of angle-irons 321 forming spacers between the support columns and to which are for example fixed as depicted here metal profiled members 323 for receiving the support plate 34 of the mast, as depicted in FIG. 32. There are for example two of these profiled members 323 disposed parallel to each other between the angle-irons 321 extending along the front and rear sides of the module 3.

The element 1 includes a roof 7 covering the support module 3 and one of the accessory modules 4. This roof 7 has a rim 70 on one side, for example to protect an electric vehicle recharging terminal (not represented) and to serve as a sunshade for the modules. Depending on what is required, the length of the rim 70 is for example of the order of 50 cm to 100 cm.

One of the doors 10 includes a lock 100 accessible from the outside.

Figure 3:
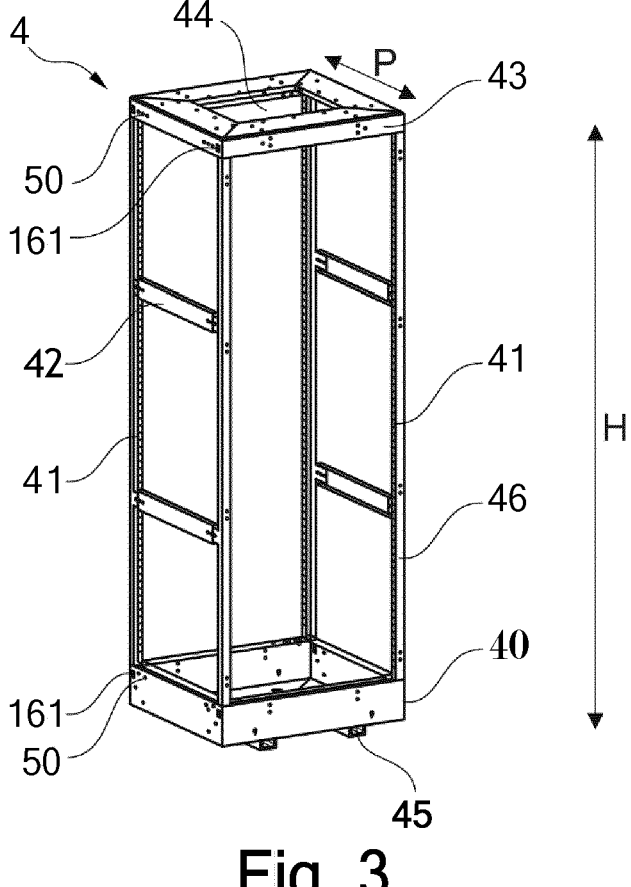
FIG. 3 is a partial and schematic representation of an example of a single accessory module according to the invention.
Figure 4:
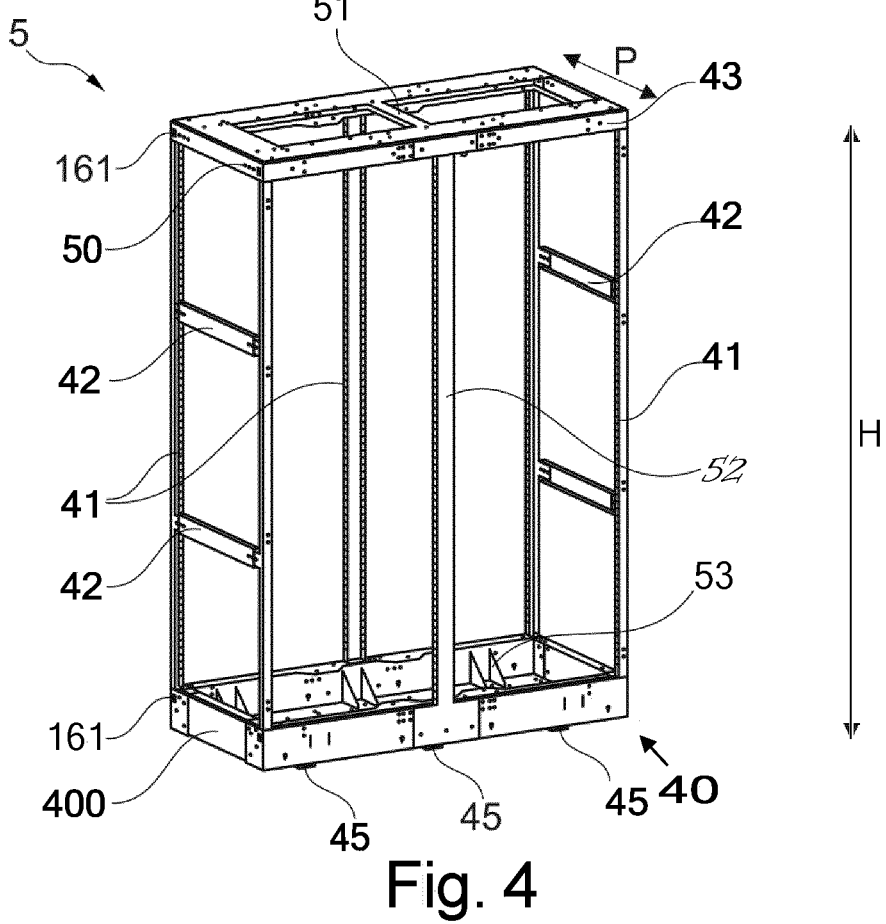
FIG. 4 is a partial and schematic representation of an example of a double accessory module according to the invention.

The element 1 is of modular construction and diverse combinations of modules are possible, depending for example on the nature of the equipment housed in the modules, as depicted in FIGS. 2 to 4.

Different types of accessory modules 4 can be assembled laterally to the support module 3 to form the element 1. There may for example be joined to it a single accessory module 4 as depicted in FIG. 3. By "single" is meant a module the dimensions of which are substantially identical to those of the support module 3.

The single accessory module 4 is preferably of parallelepipedal general shape and includes four vertical uprights 46 resting on a lower box section 40. The latter may include horizontal panels 400 and be retained in the upper part by a frame 43. Crossmembers 42 may be fixed between the uprights 46 to reinforce the structure of the module, in particular on its lateral faces. The retaining frame 43 may in particular include an opening 44 enabling circulation of air in the module. The box section 40 and the retaining frame 43 preferably have openings 161 on their lateral sides to enable the passage of locking links.

Vertical rails 41 forming a rack are disposed on each of the uprights 46 to enable the fixing of the vertical panels 9, some of the hinges of the doors and some of the locking elements of the modules. Similar rails 41 are fixed to the support columns 30 of the support module 3. The rails 41 are for example fixed in the lower part by means of a plate 410 that is for example screwed onto a horizontal upper rim 401 of the horizontal panels 400 of the box section 40 at the bottom of the modules.

There may also be assembled to the support module 3 a double accessory module as depicted in FIG. 4. Here "double" means a module having a width substantially twice that of the support module 3.

The double accessory module 5 may have a structure similar to that of the single accessory module 4, for example with four vertical uprights 46, a box section 40 at the bottom, a retaining frame 43 and vertical rails 41 fixed to the uprights

46. It may additionally include intermediate uprights 52 at the front and at the rear onto which are also fixed rails 41. A bridge 51 can connect the two longer sides of the upper frame 43. These additional elements enable the fixing of panels 9, doors 10 and/or decks 11 identical to those that can be fixed to the support module 3 and the single accessory module 4.

The double module 5 may further include stiffening angle-irons 53 between the bottom and the vertical walls of the bottom box section 40, fixed for example by welding.

The modules 4 and 5 rest for example on the ground on a footing including two members 45 extending from the front to the rear of the modules.

The bottom box section 40 may be produced by assembling two U-shaped parts on lateral horizontal panels 400 or in some other way.

All the modules 3, 4 and 5 have on their lateral faces fixing means 50 enabling them to be assembled laterally together to form the modular assembly 6, in particular by being bolted together. All the modules have substantially the same height H and the same depth P; consequently, the modular assembly 6 obtained in this way exhibits a continuity of surface, in particular at the front and at the top.

The modular assembly 6 may have diverse configurations, some examples of which are represented in FIGS. 5 to 9.

As depicted in FIG. 5 a single accessory module 4 is for example assembled on the left of the support module 3.

Figure 8:
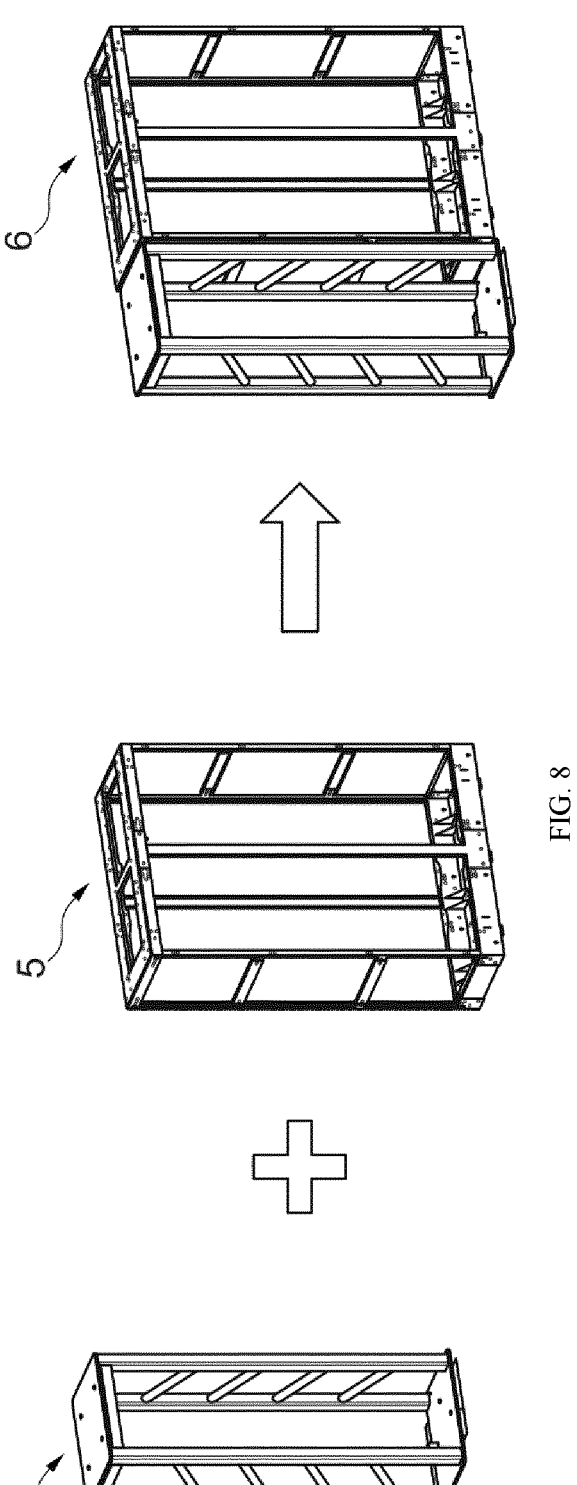
FIG. 8 is a partial and schematic representation of another example of an assembly comprising a support module and a single accessory module.

Alternatively, as represented in FIG. 6 it may be assembled on the right of the support module 3. A double accessory module 5 may also be assembled on the left of the support module 3, as represented in FIG. 7, or on its right, as represented in FIG. 8.

Figure 9:
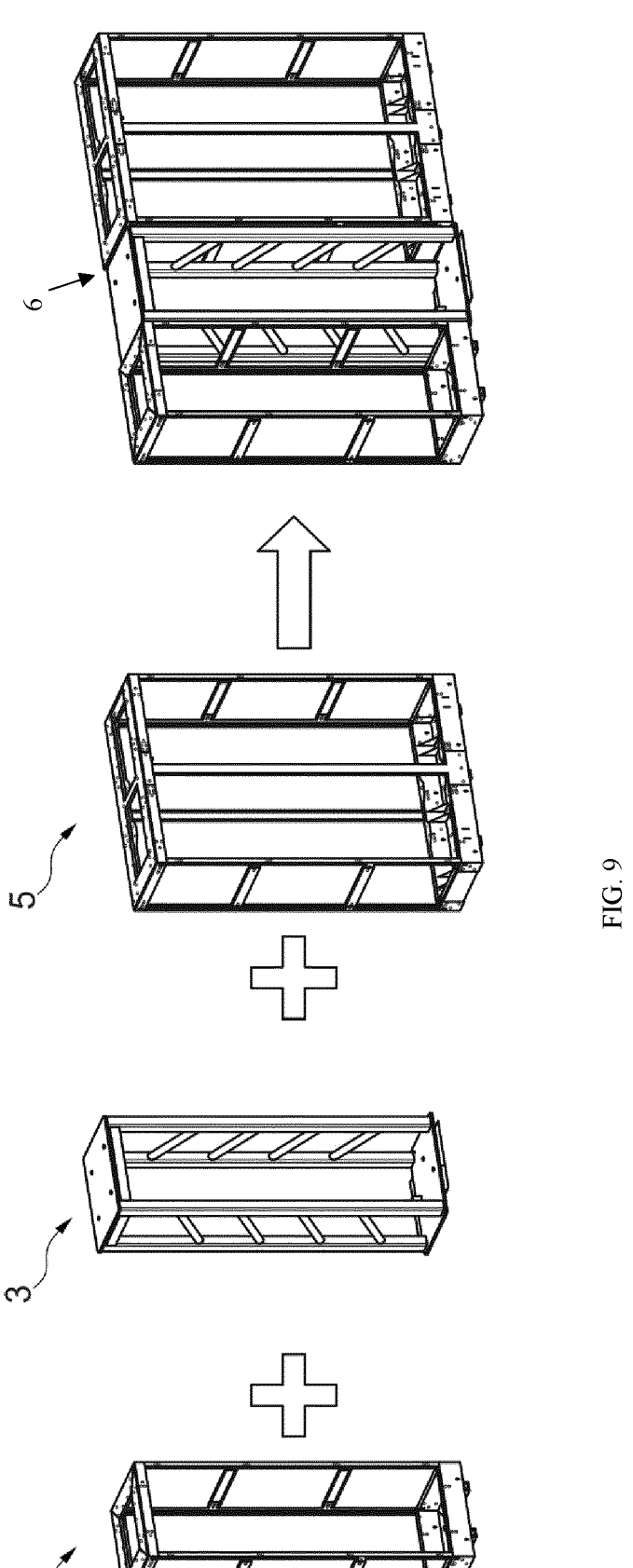
FIG. 9 is a partial and schematic representation of an example of an assembly comprising a support module, a single accessory module and a double accessory module.

Alternatively, an accessory module 4 may be assembled on each side of the support module 3, for example a single module 4 on its left and a double module 5 on its right, as depicted in FIG. 9.

Of course, the possibilities of assembling modules are not limited to what has just been described. The number of modules assembled to form the modular assembly 6 is not limited, provided that it includes at least one support module 3, and any other arrangement may be envisaged, provided that the modules are assembled laterally. One or more accessory modules may for example be added to any of the assemblies described hereinabove.

The modular assembly 6 may accept electrical equipment E of varied types inside it.

Figure 10:
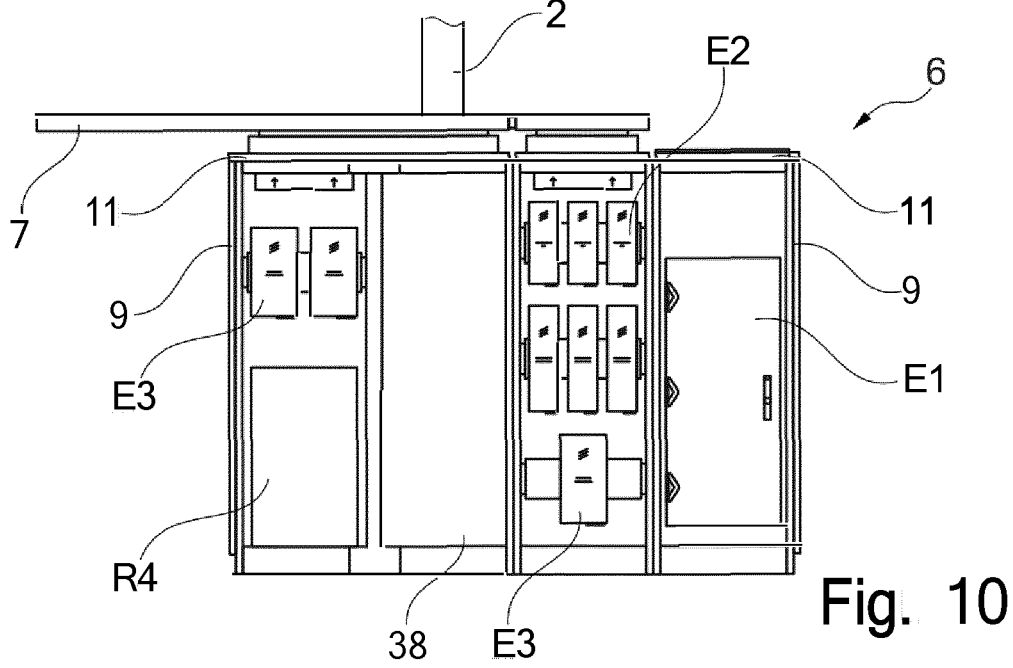
FIG. 10 is a front view of an example of an infrastructure element partially and schematically depicting an example of the arrangement of the equipment in the modules and the saving of space obtained when the mast is supported by the support module.

In the example depicted in FIG. 10 a first single accessory module 4 receives a 19-inch cabinet E1, for example pre-equipped before integration into the module. Other accessory modules 4 receive radio equipment E2 and E3 of varied sizes, and for example a space R4 for equipment of an electricity supplier or another 19-inch cabinet. Not having the mast 2 pass through it, the support module 3 defines an internal volume 38 that can advantageously receive equipment and if required enables easy connection of some of the equipment to the antenna 20 carried by the mast 2.

Figure 11:
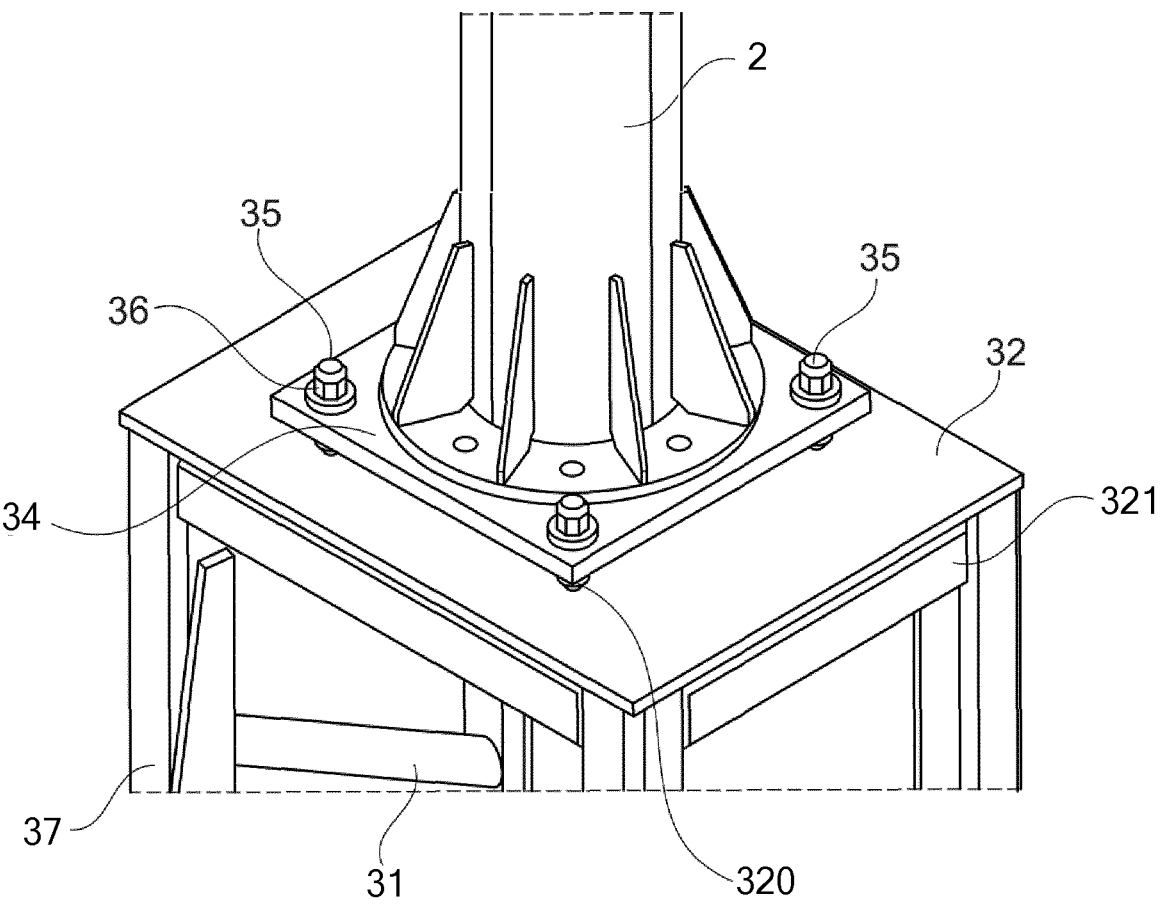
FIG. 11 depicts partially and schematically an example of fixing the mast to the top of the support module.

As depicted in FIG. 11 the mast 2 may be fixed to the upper part 32 of the support module 3 by means of a support plate 34 the seating of which is adjustable relative to the rest of the support module by means for example of four bolts 35 inserted in the aforementioned fixing holes 320 and bearing nuts 36 situated on top of the plate 34 and under the deck 32 of the support module 3. This enables adjustment of the verticality of the mast 2 when installing the modular assembly 6 and correction of any depointing thereof if the seating of the modular assembly 6 is not perfectly horizontal.

Figure 12:
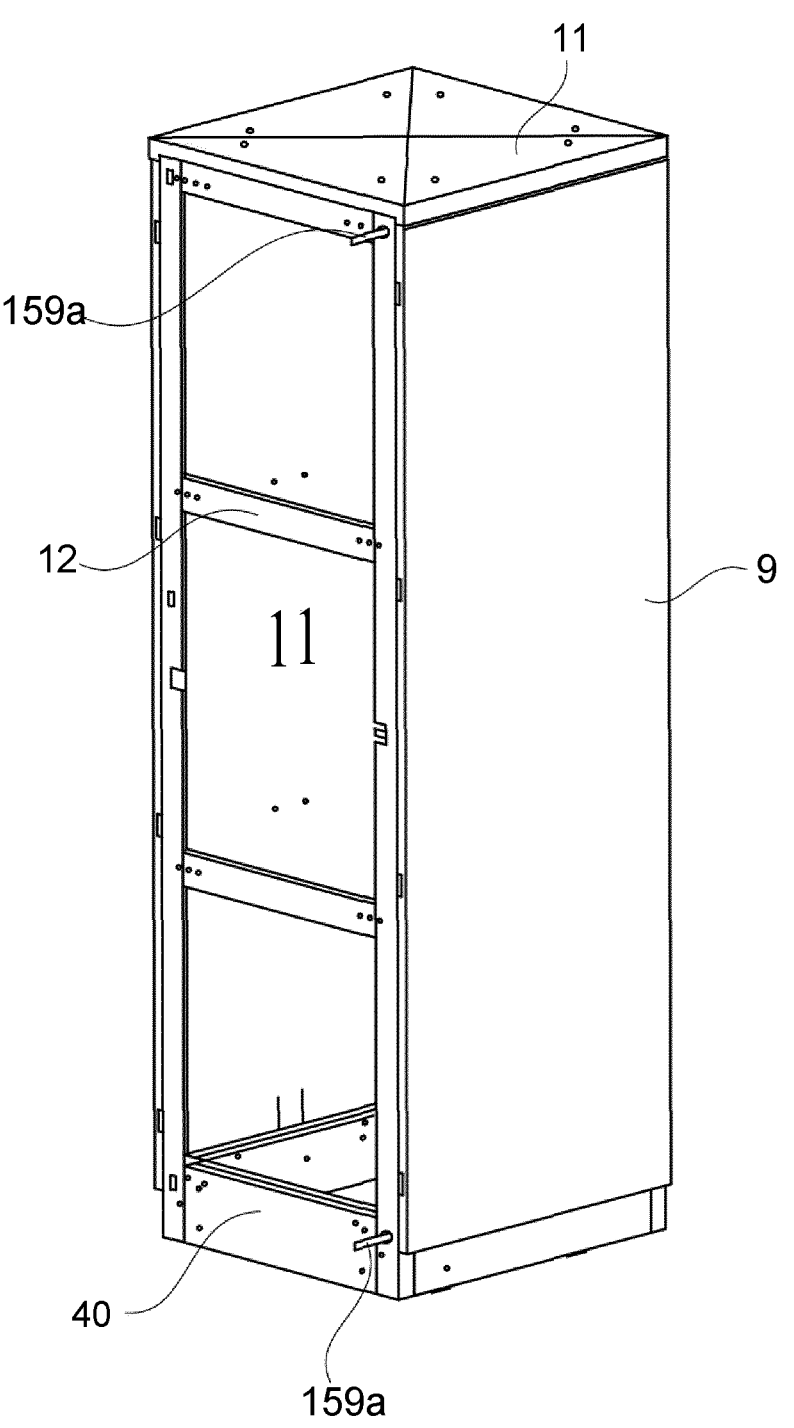
FIG. 12 depicts partially and schematically an example of a module including a vertical enclosure panel.

The modules 3, 4 or 5 forming the modular assembly 6 each include at least one vertical enclosure panel 9, as depicted in FIG. 12. The modules 3, 4 or 5 are moreover closed at the top by a for example metal deck 11. In the FIG. 12 example the panel 9 is fixed to the frame 12 of a single module 4, but it may likewise enclose a support module 3 or a double module 5. A double module 5 may include two enclosure panels 9 disposed side-by-side across its width. The enclosure panels 9 are fixed to the frame 12 of a module 3, 4 or 5 in such a manner as to leave a space at the base of the module between the ground and the bottom of the panels, facilitating entry and circulation of air.

Figure 13:
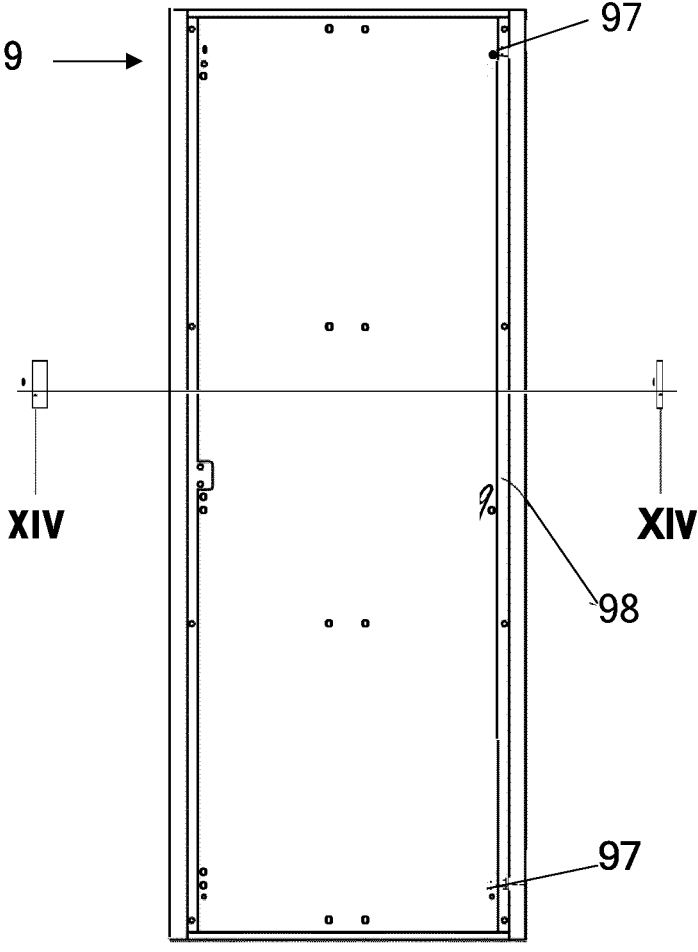
FIG. 13 is a partial and schematic view of a vertical enclosure panel of a module.

Each enclosure panel 9 is preferably of rectangular shape, as depicted in FIG. 13, and is preferably made of metal. Its height is for example between 1.90 m and 2.10 m. It includes for example fixing means 97 enabling it to be bolted to the frame of the corresponding module. It may further include a support 98, for example at mid-height, enabling fixing of the strike 130 of a lock when the panel is used as a door 10, as described later.

Figure 14A:
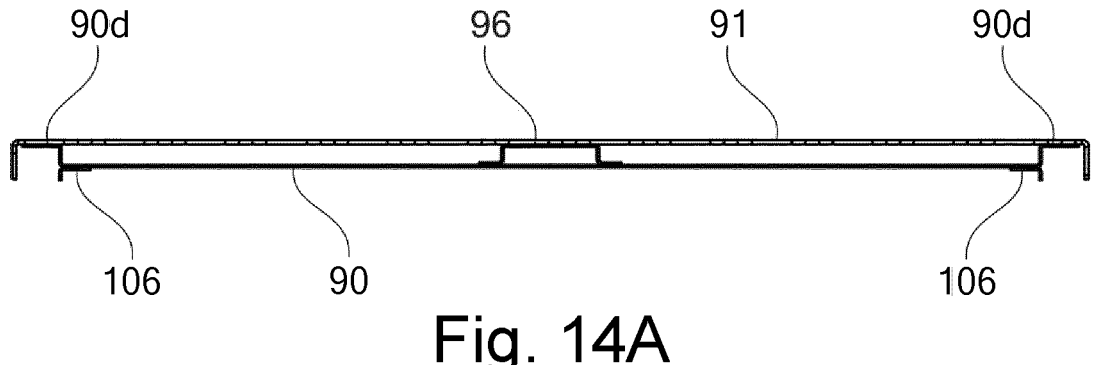
FIG. 14*a* is a partial and schematic horizontal section taken along the line XIV in FIG. 13 of the enclosure panel from that figure.
Figure 14B:
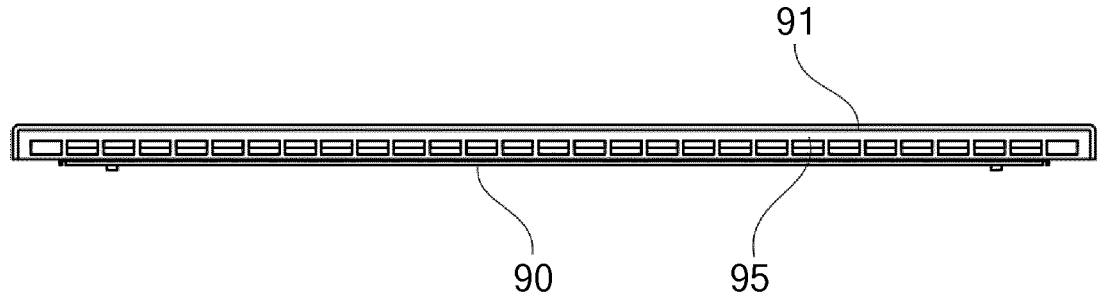
FIG. 14*b* is a partial and schematic top view of the FIG. 13 enclosure panel.
Figure 14C:
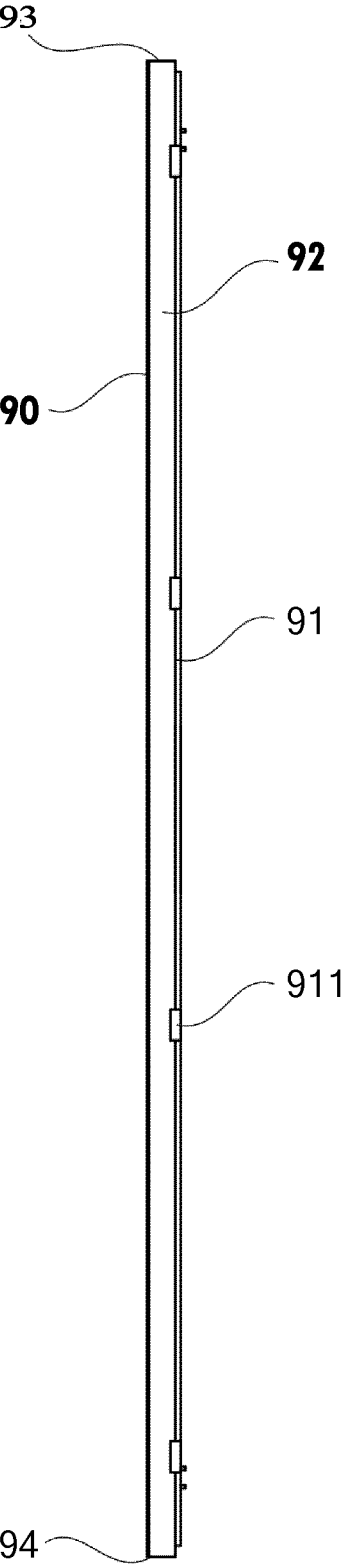
FIG. 14*c* is a partial and schematic side view of the FIG. 13 enclosure panel.

As represented in FIGS. 14A, 14B and 14C the enclosure panel 9 is double-walled; it includes an interior wall 90 and an exterior wall 91 defining an air knife 92 with the interior wall. The walls 90 and 91 are preferably manufactured separately and then assembled by welding them together, as depicted in FIG. 14C. The interior wall may have raised edges 90d on the sides which come to bear against the interior surface of the exterior wall. The raised edges 90d define a plane surface parallel to the facing surface of the exterior wall 91. The depth of the offset formed by each raised edge corresponds to the thickness of the air knife that is required between the interior and exterior walls.

The enclosure panel 9 includes at least one opening 93 in the lower part and at least one opening 94 in the upper part, allowing circulation of air by natural convection between the walls 90 and 91. As depicted in FIG. 14B the upper opening 94 is preferably defined by a horizontal grille 95. The latter may be made in one piece with at least one of the walls 90 or 91 of the panel 9. Alternatively, it is mounted over the opening 94 after the double wall has been manufactured. The panel 9 may further include a similar grille disposed in the lower opening 93.

The panel 9 may further include one or more preferably metal internal reinforcements between the walls 90 and 91, in particular a vertical reinforcement 96 as depicted in FIG. 14A.

Figure 15:
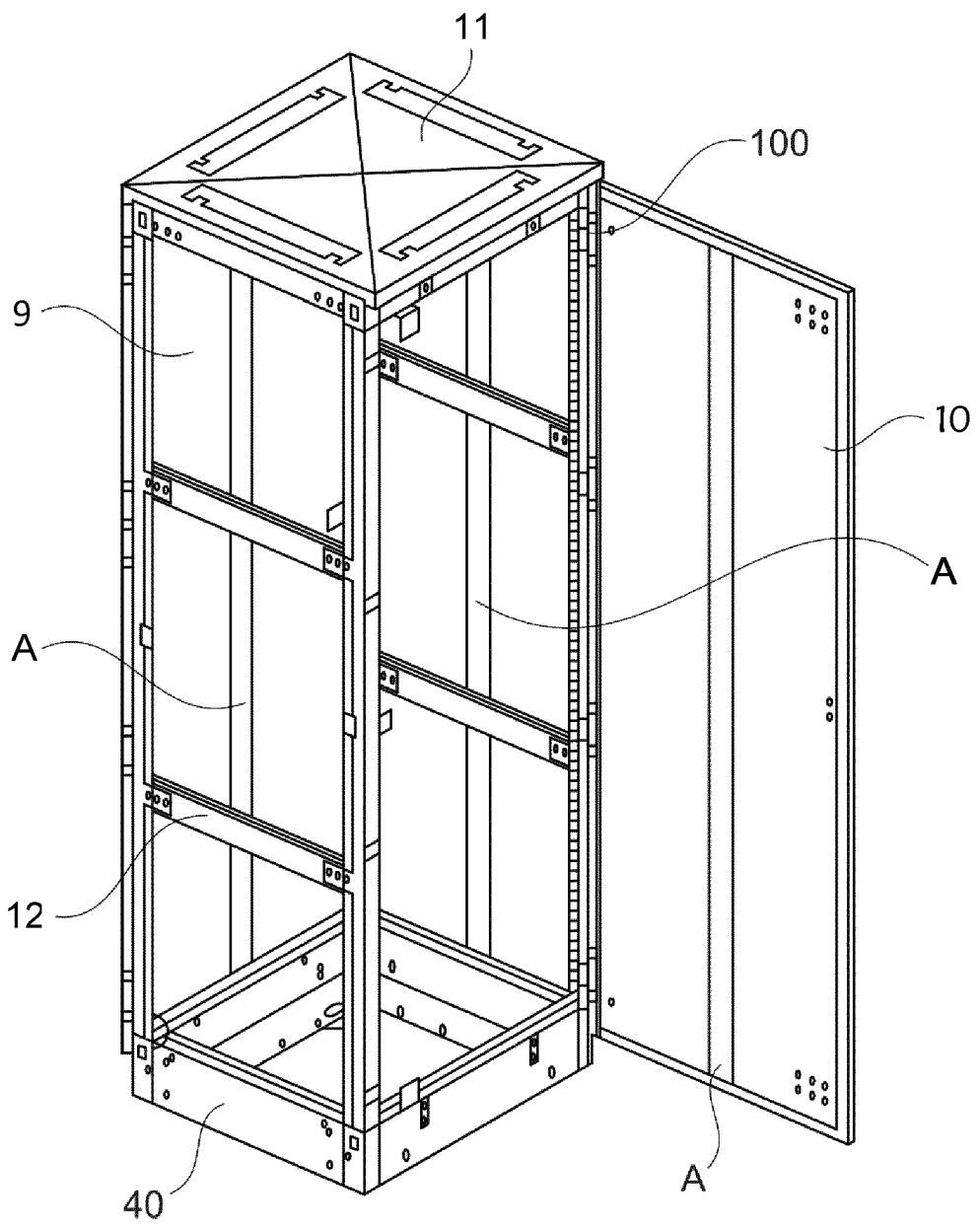
FIG. 15 depicts partially and schematically an example of a module including a door on one of its vertical faces, the interior wall of the panels and of the door not being represented in this figure in order to show the central vertical reinforcement.
Figure 16:
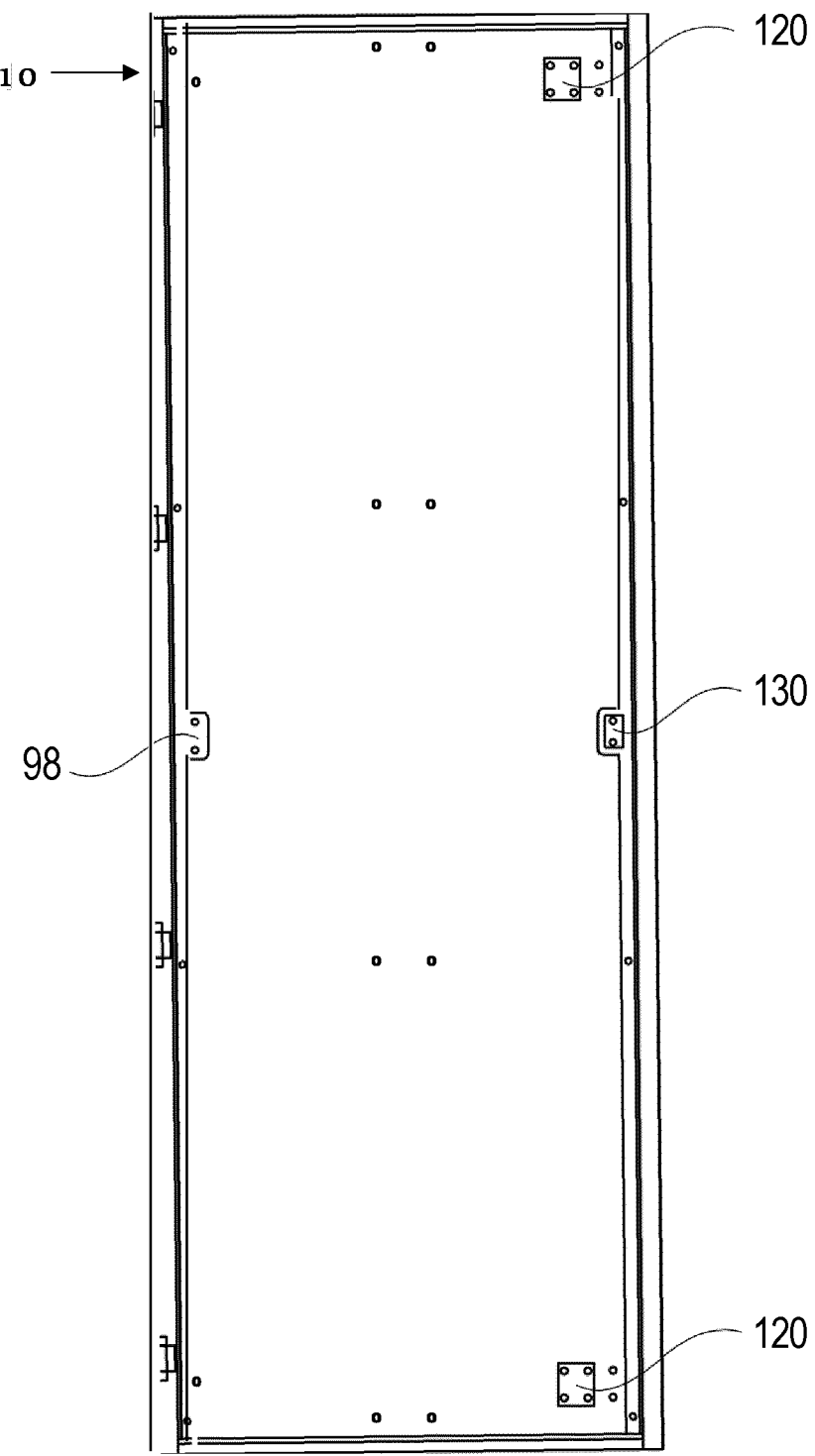
FIG. 16 is a partial and schematic front view of an example of a door of a module.

The support module 3 or a single or double accessory module 4 preferably includes at least one vertical door 10, as depicted in FIG. 15, fixed to the frame 12 by means of hinges 100.

A double accessory module 5 may include two adjacent doors 10 across its width.

The doors 10 with no lock visible from the outside may be produced based on structures identical to those of the panels 9 onto which are fixed hinges 100 and elements enabling locking thereof.

Figures 17A, 17B:
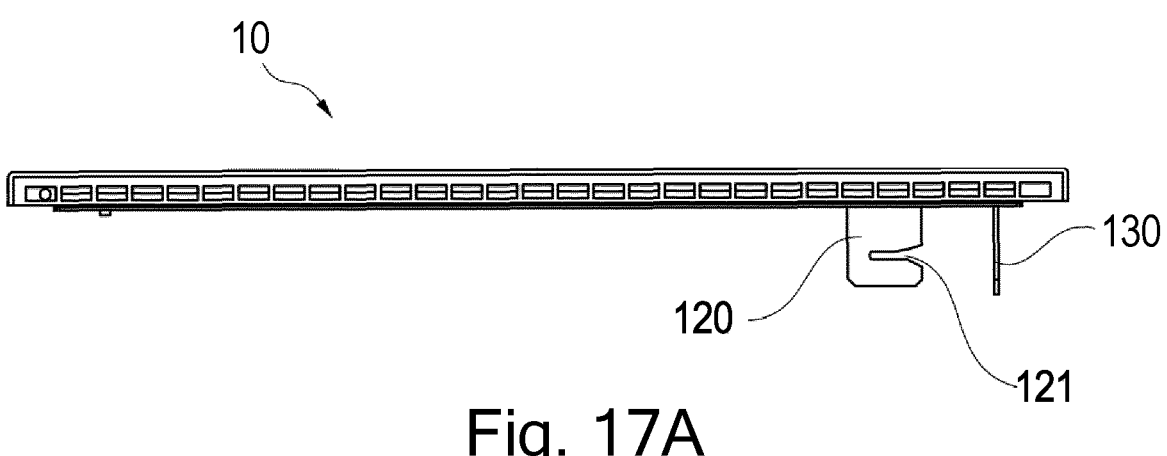
FIG. 17*a* is a partial and schematic top view of the door from FIG. 15.
FIG. 17*b* is a partial and schematic side view of the door from FIG. 15.

The locking elements may include a locking lug 120, as depicted in FIGS. 17a and 17b, and at mid-height of the door a strike 130 adapted to receive the bolt of a lock, for example of slam lock type.

Figure 18:
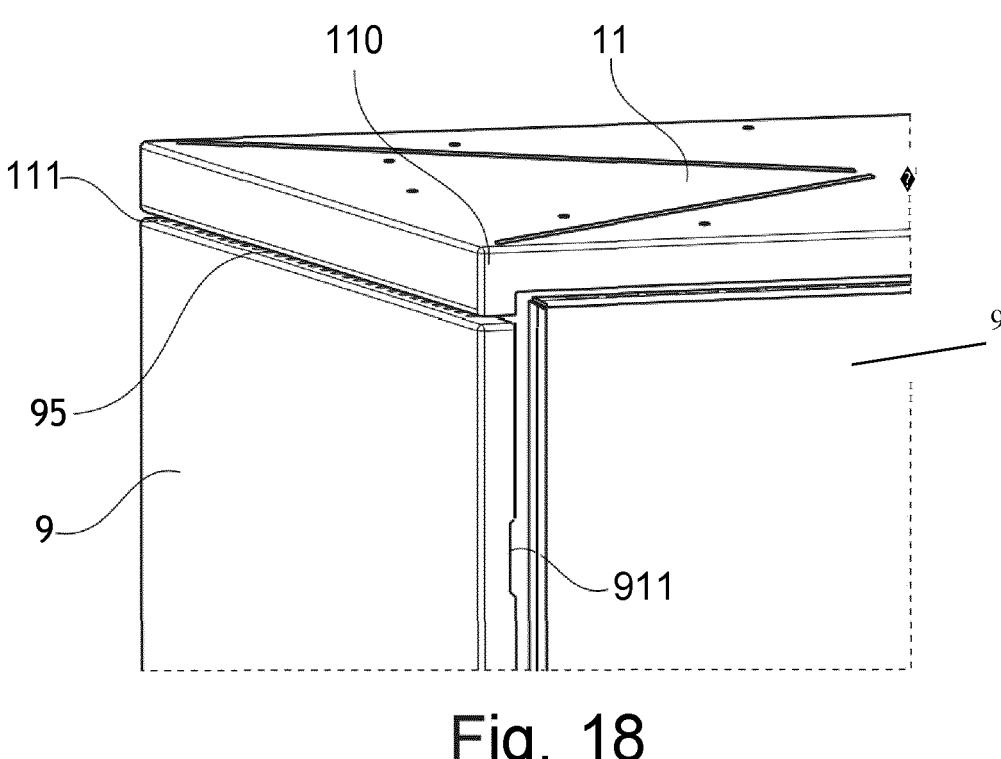
FIG. 18 is a partial and schematic perspective view of the upper part of an example of a module.

As represented in FIG. 18 the deck 11 for a single module may include a rim 110 that overlies the vertical panels 9 of the corresponding modules or the door 10 of that module.

Figure 19:
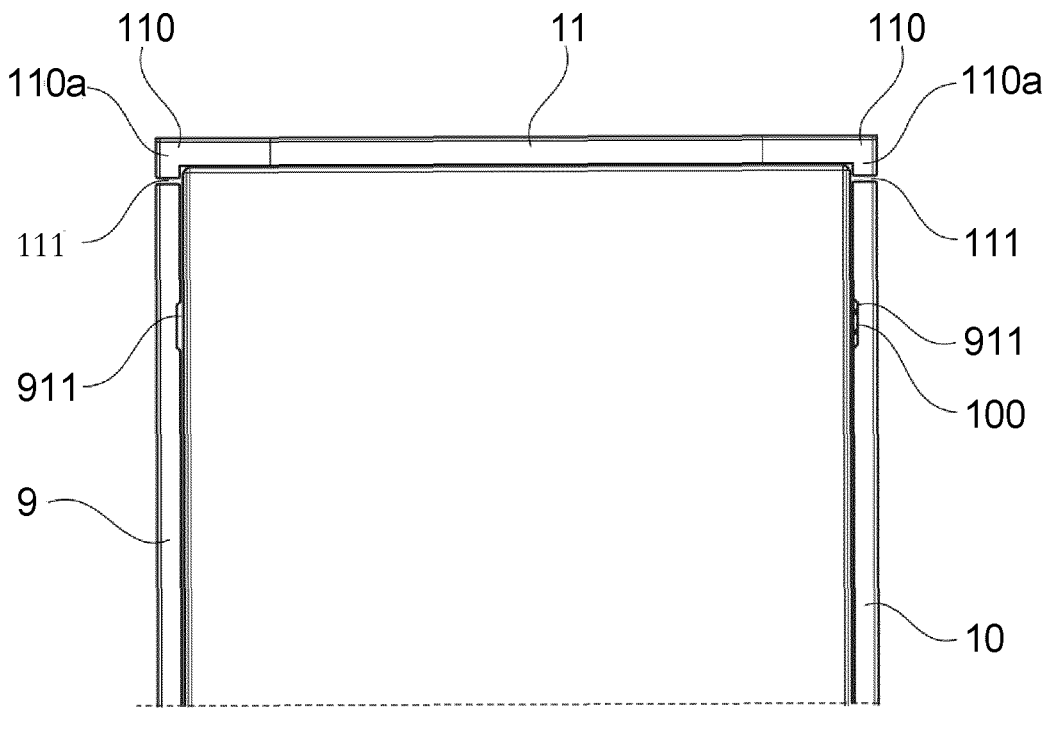
FIG. 19 is a partial and schematic side view of the module assembly.

As depicted in FIG. 19, in the example considered here the edge of the rim 110 of the deck 11 may have a vertical return 110a situated substantially in vertical alignment with the exterior face of the lateral vertical panels 9. A relatively small clearance 111 is provided between the grille 95 covering the upper part of the panels 9 and the return 110a in order to enable hot air circulating upwards in the double wall of the enclosure panels 9 or the door 10 to escape to the outside.

Figure 20:
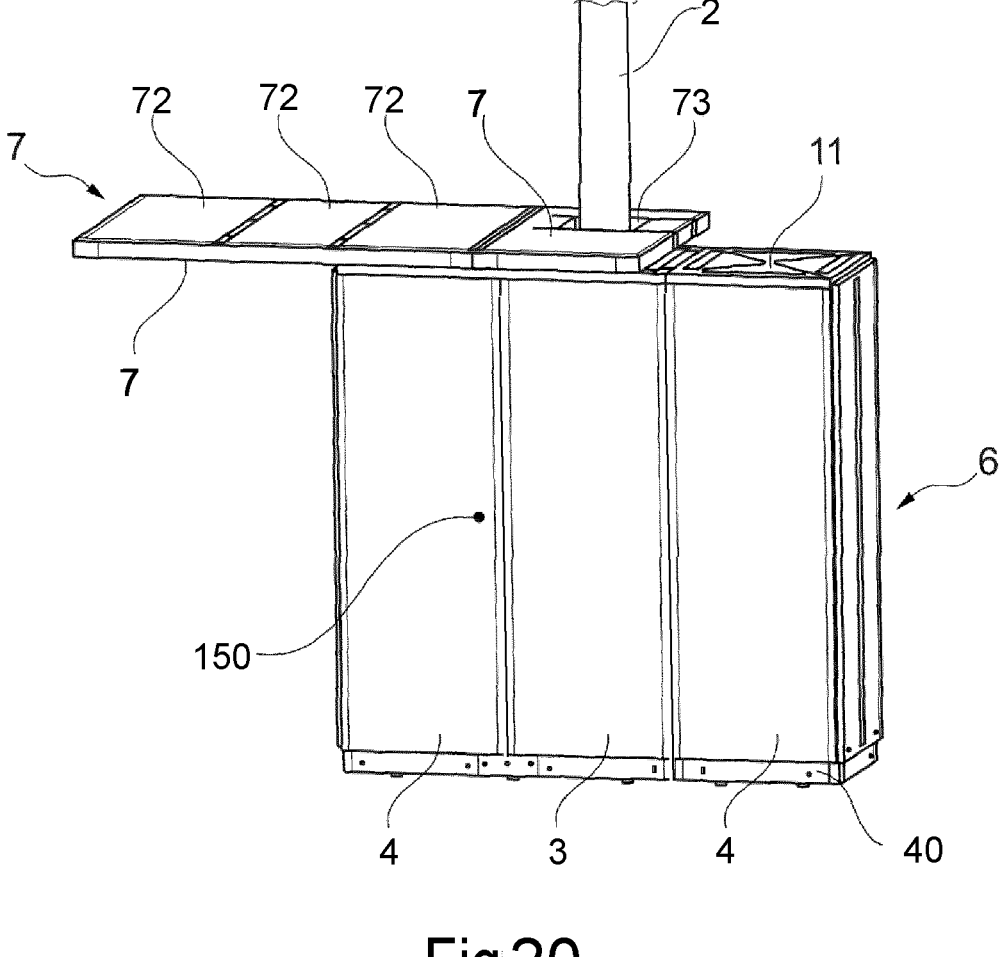
FIG. 20 is a partial and schematic perspective view of an example of an infrastructure element including a modular roof at least partly covering the modules of the element.

In the example depicted in FIG. 20 the roof 7 substantially covers the support module 3 and the accessory module 4 assembled on its left. It further has a rim 70 able for example to serve as a sunshade or to protect from rain a user of the modular assembly 6 or of a terminal beside it.

The roof 7 has a modular structure with sections 72 assembled laterally enabling the size of the roof to be adapted to the size of the modular assembly 6 whatever the arrangement and the number of the modules 3, 4 and/or 5 constituting it.

As depicted here, one of the sections 74 may include an opening 73 enabling the mast 2 to pass through it. This section 74 preferably includes a removable part 75 which, when removed, opens the opening 73 laterally to the outside, which enables fitting of the roof when the mast 2 is already fixed onto the support module 3. The various modules of the roof are for example assembled by bolting them together.

Figure 21:
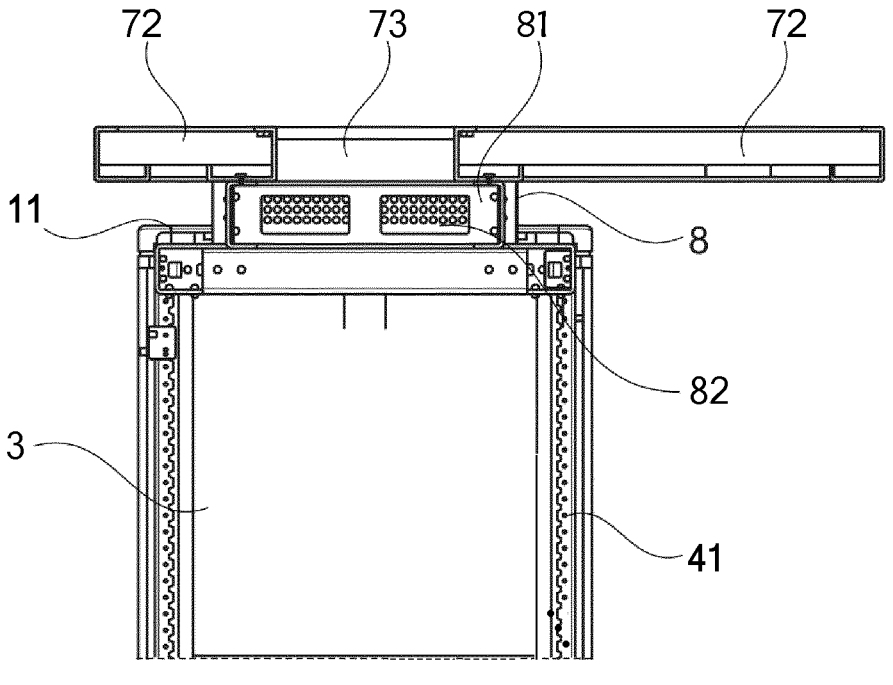
FIG. 21 is a partial and schematic vertical section of the element from FIG. 20 depicting the opening in the roof enabling passage of the mast.

The roof 7 is preferably supported at a distance from the decks 11 of the modules that it covers by a support 8 represented in FIG. 21. The roof 7 is for example bolted to this support 8.

Figure 22:
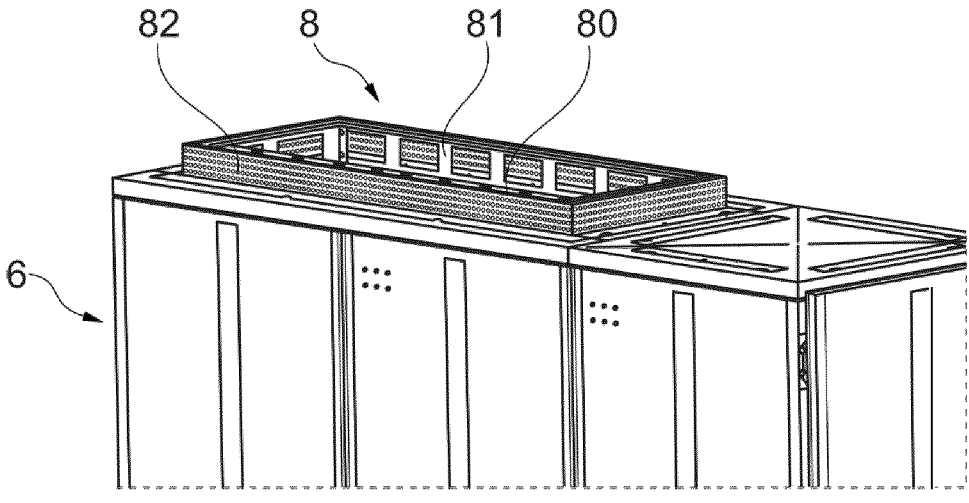
FIG. 22 depicts schematically and partially an example of an apertured support carrying the roof at a distance from the decks of the module or modules that it covers.

In the example considered here the support 8 is of rectangular shape and, as depicted in FIG. 22, defines an opening 80 that is longer than it is wide, which enables fitting of the section 72 including the opening 73 in multiple configurations, depending on the arrangement of the underlying modules, and in particular on the position of the support module 3 relative to the accessory modules 4 or 5. The support 8 has for example a length enabling positioning on two consecutive single modules or one double module or on a single module and half a double module.

The support 8 preferably includes apertured vertical walls in such a manner as to allow air to circulate, for example vertical walls 81 with substantially rectangular apertures that are relatively wide and covered by exterior grilles 82. A structure of this kind in particular enables dissipation of heat accumulated in the modular assembly 6, caused for example by heating of the electrical equipment and/or exposure of the element 1 to the sun. The deck 11 of the accessory module 4 situated on the left in FIG. 22 is open so that the module 4 opens at the top into the interior of the support 8. In this example the module 3 is closed at the top by the plate that supports the mast.

Figure 23:
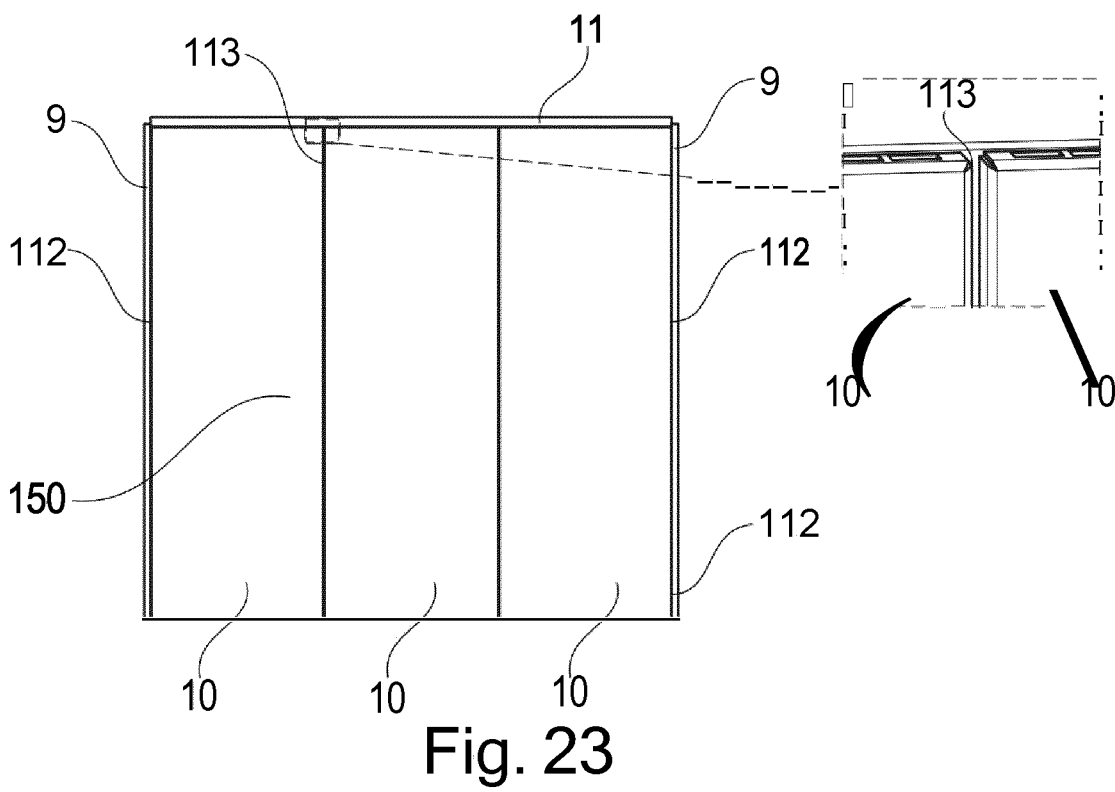
FIG. 23 is a partial and schematic front view of an assembled plurality of modules depicting the small clearance between the doors of the modules when they are closed.

As depicted in FIG. 23 each door 10 of the modular assembly 6, when closed, has a small clearance 112 relative to the frame 12 onto which it is fixed. In a similar manner, two adjacent doors, for example of a double accessory module, have a small clearance 113 between them. The clearance 113 is for example less than or equal to 1 cm, better yet less than or equal to 8 mm, being for example of the order of 6 mm.

Figure 24:
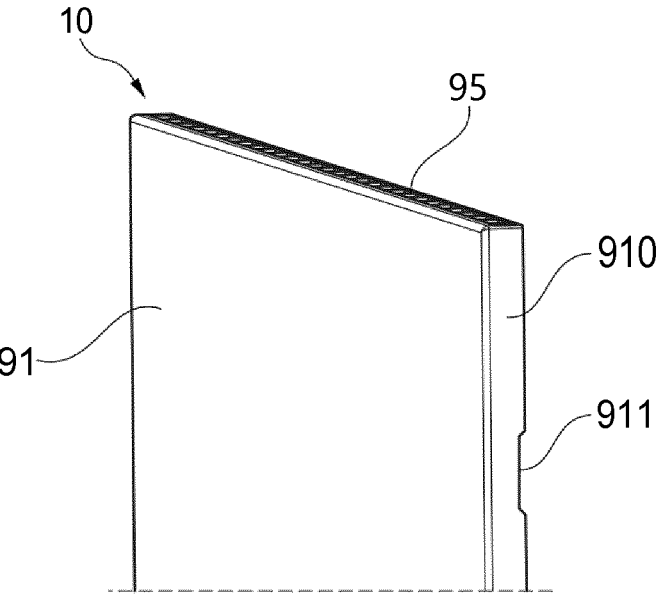
FIG. 24 is a schematical and partial perspective view of the upper part of an example of an enclosure panel or door according to the invention.

This small clearance may be obtained by means of a specific way of mounting the door 10. As depicted in FIG. 24, the preferably metal exterior wall 91 of the door 10 that defines the principal face thereof has along one vertical side a return 910 including notches 911. This return 910 includes for example four notches 911 corresponding to the positions of four hinges 100.

Each of the latter includes a fixed knuckle 101 at least one node 101a of which is connected by a U-link to the frame 12, the U-link including an angle-iron 103 one flange 103a of which is parallel to the frame 12, and a mobile knuckle 102 connected to the interior wall 90 of the door 10. The node 101*a* of the fixed knuckle 101 is surrounded by two nodes 102*a* of the mobile knuckle 102, which pivots about a rotation axis 109. The nodes 101*a* and 102*a* cannot be seen when the door is closed, which contributes to the resistance of the element 1 to forced entry and to its esthetics.

Figure 25:
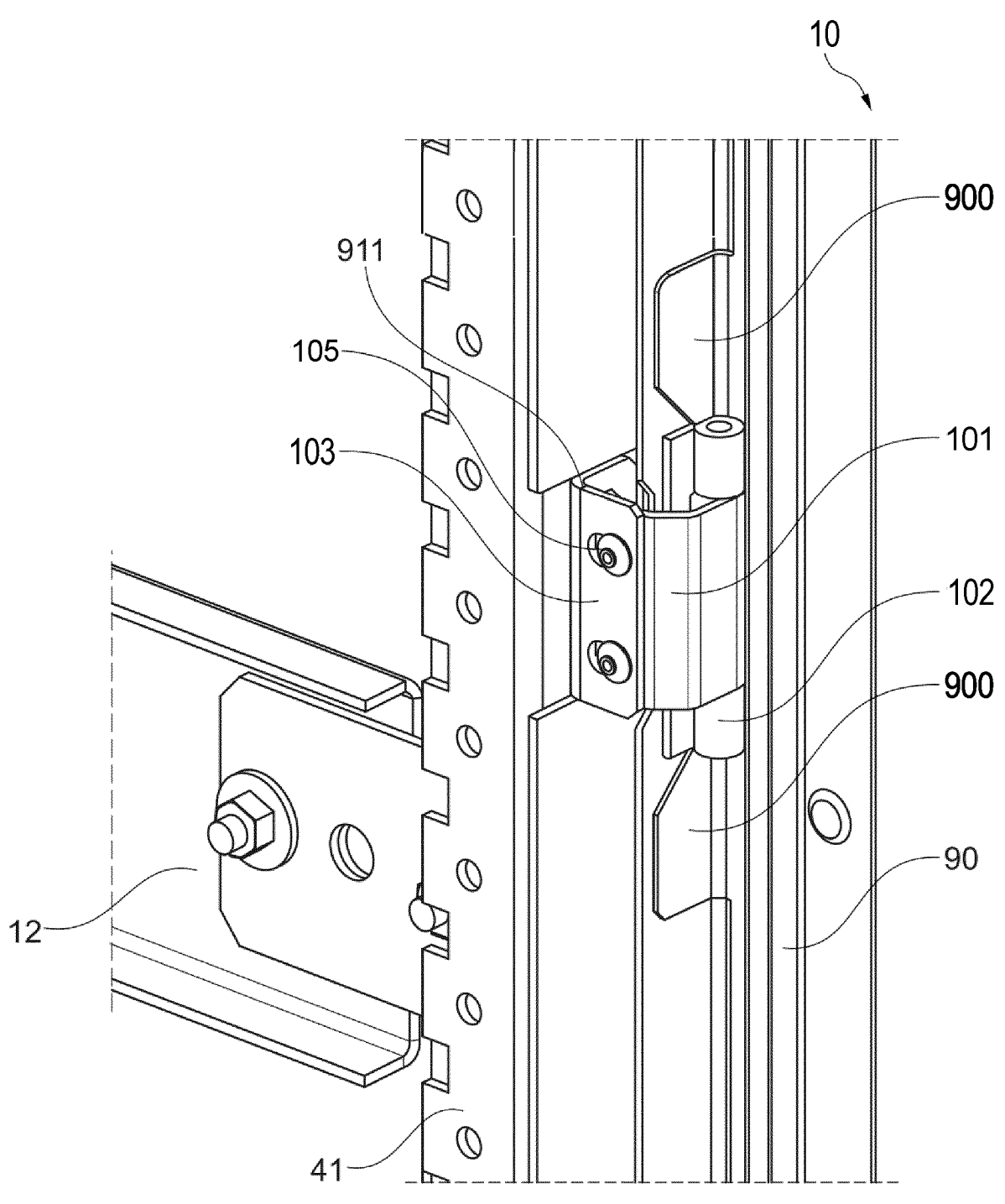
FIG. 25 is a schematic and partial perspective view of an example of a hinge of a door of a module according to the invention when the door is in the open position.

As depicted in FIG. 25 the fixed knuckle 101 is engaged in the notch 911 when the door 10 is in the open position (with an opening angle of approximately 90° in the example depicted).

The door 10 further includes positioning fins 900 formed by cutting out its interior wall 90, the distance between which corresponds to the length of the mobile knuckle 102 in order to be able to serve as a marker for fixing the mobile knuckle 102 to the door 10 without requiring measurement. The mobile knuckle 102 is for example welded to the vertical return of the exterior wall 91 of the door 10.

Figure 26A:
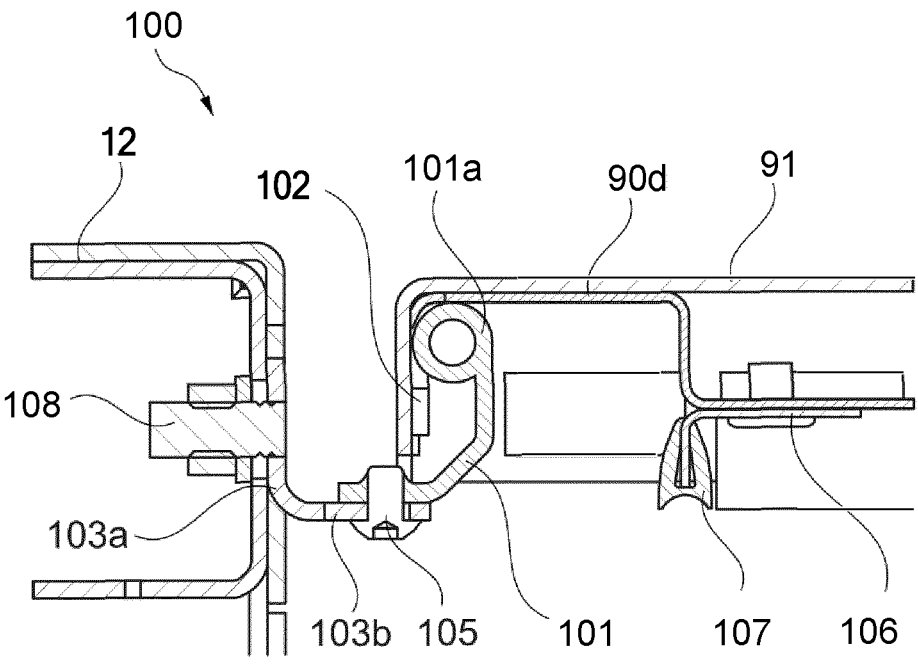
FIG. 26*a* is a schematic and partial horizontal section of the hinge from FIG. at mid-height.
Figure 26B:
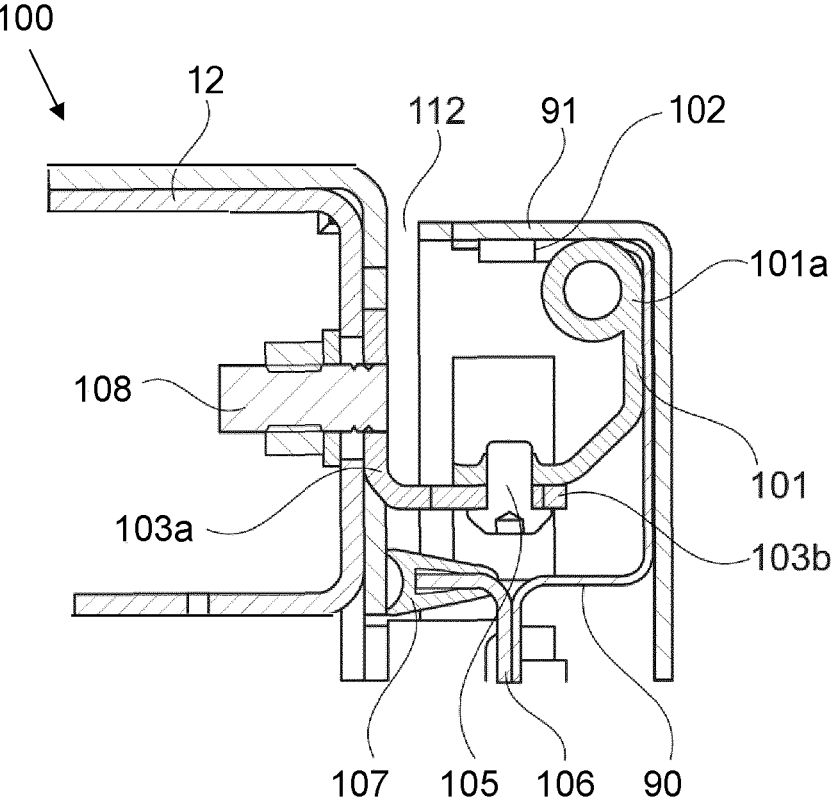
FIG. 26*b* is a schematic and partial horizontal section of the hinge from FIG. at mid-height when the door is in the closed position.

One of the hinges 100 is depicted in more detail in FIGS. 26*a* and 26*b*.

The angle-iron 103 includes a flange 103*a* extending parallel to the frame 12 and fixed to the latter by bolts 108, for example, and a second flange 103*b* fixed to the fixed knuckle 101, for example by rivets 105.

The interior wall 90 carries an angle-iron 106 fitted with a seal 107 that is pressed against the frame 12 when the door is closed, as depicted in FIG. 26*b*. The door also includes top and bottom horizontal seals (not visible in the figures).

The following example considers an infrastructure element 1 including at least two doors, a door 16 including a lock 150 visible from the outside and a door 17 with no visible lock.

Figure 27:
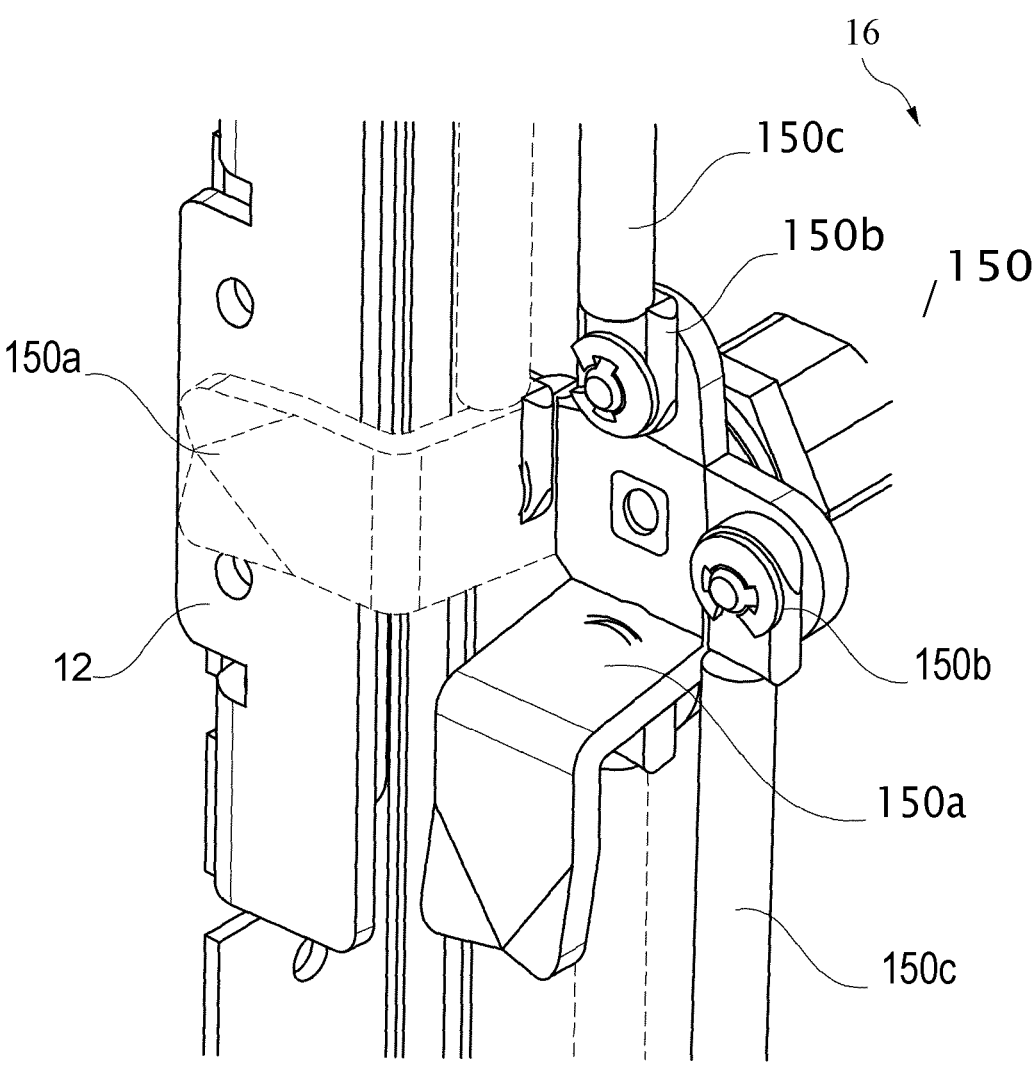
FIG. 27 is a partial and schematic perspective view of a three-point lock of a door with a visible lock.

The lock 150 is for example a three-point lock that is maneuvered by means of a triangular key for example. A lock of this kind has been depicted in FIG. 27 in an unlocked position. The corresponding locked position is represented in dashed line. In this example the three-point lock includes a cranked locking lug 150*a* pivoting through an angle of 90° during unlocking and an L-shaped part 150*b* connected to two links 150*c* guided by guides 166 fastened to the door 16 as far as the top and bottom of the latter, respectively, and adapted to engage in corresponding housings 165 when the door is locked.

The infrastructure element may include a mechanism for locking the other doors 17 with no visible lock, which enables unlocking of the other doors from the inside once the access door 16 provided with the lock 150 is open.

Figure 29:
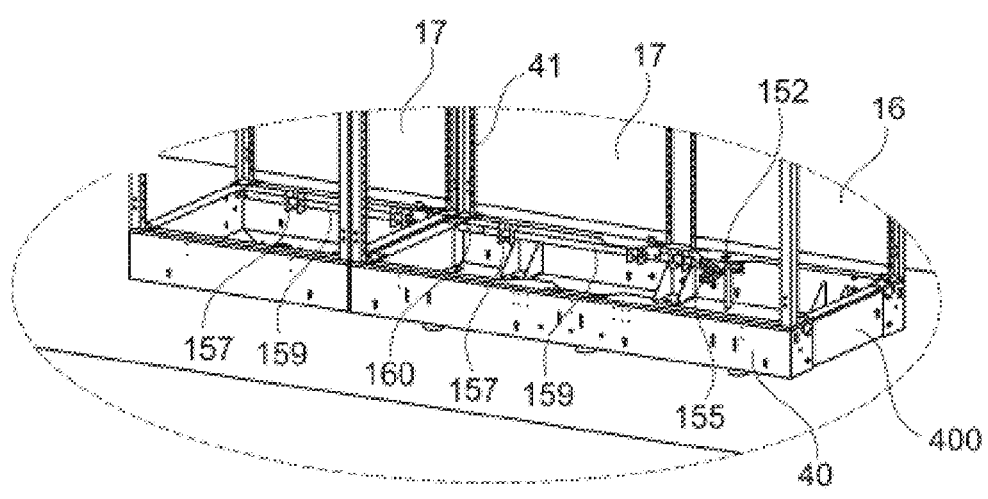
FIG. 29 is a partial and schematic perspective view of the whole of the bottom part of an infrastructure element according to the invention including a bottom unlocking linkage.

This mechanism may include top and bottom linkages 151 to be actuated manually, as depicted in FIG. 29.

Each linkage 151 may include a link 156 guided in horizontal sliding by guides 157 fastened to the frame 12. The guides 157 are for example produced in pairs by means of vertical openings on the flanges of a U-shaped part fixed to the box section 40 at the bottom of the module.

Figure 28:
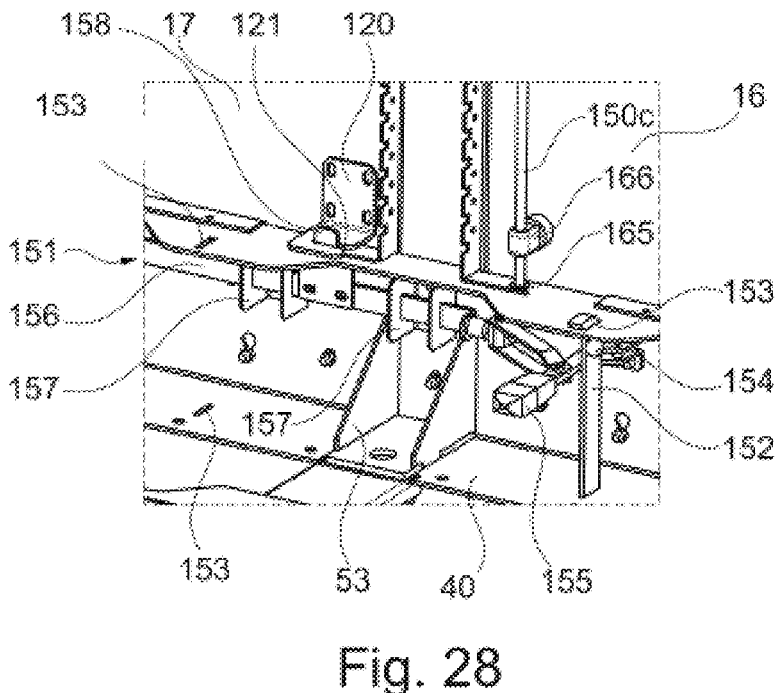
FIG. 28 is a partial and schematic perspective view of the bottom of the door from FIG. 27.

A pivoting lever 155 enables the link to be moved between a locked position represented in FIG. 28 and an unlocked position.

Each link 156 includes one or more locking tongues 158 that come into interengagement when the link 156 is in the locked position in notches 121 formed on lugs 120 fastened to the door 17.

Figure 30:
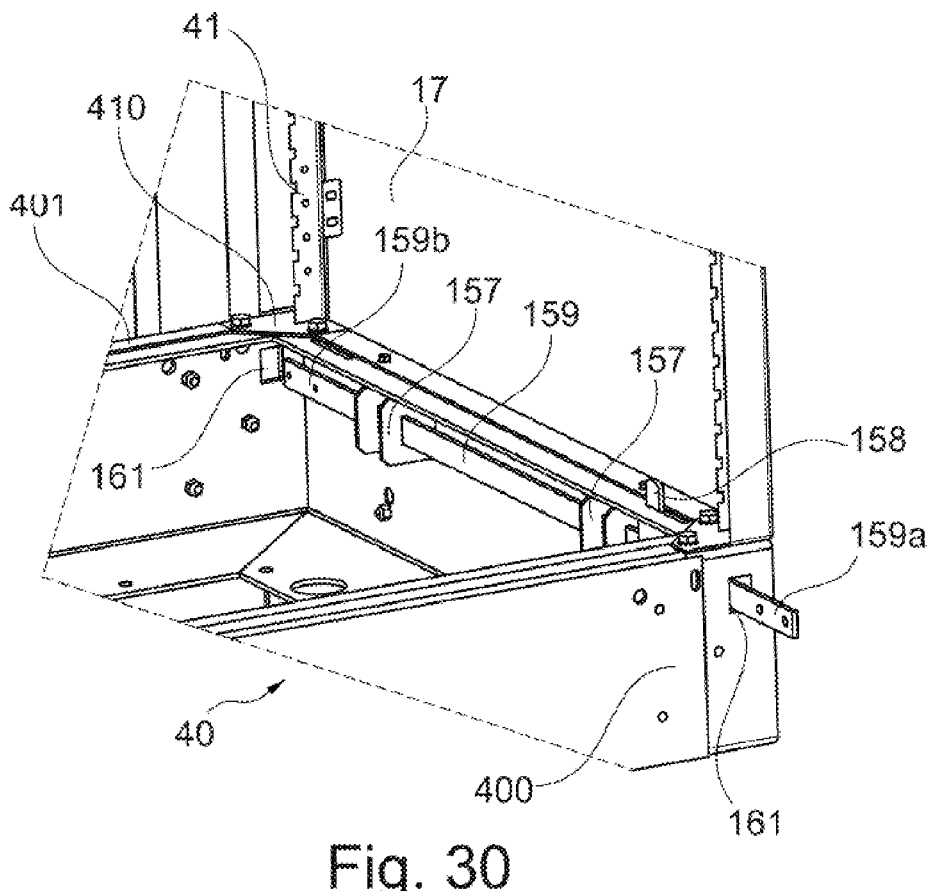
FIG. 30 depicts schematically and partially the modular aspect of the unlocking linkage from FIG. 29.

To adapt to the shorter or longer construction of the modular assembly 6 the link 156 may be formed by the end-to-end assembly of a plurality of sections 159; as depicted in FIG. 29, the assembly of two consecutive sections 159 may be effected with a connecting piece 160 that connects the parts 159*a* and 159*b* of the link sections 159 of two adjacent modules. To this end each module is provided with openings 161 on the lateral sides of its bottom box section 40, as depicted in FIG. 30, enabling parts 159*a* of one or more sections 159 to project out of the module in order to be connected to another link section present inside the adjacent module. The modules preferably also include openings 161 on the lateral sides of the retaining frame 43 to enable the passage of the links 156 of the top linkages 151.

A locking bar 152 enables blocking of the actuation of the lever when in place. This bar 152 is received in corresponding openings 153 in the frame 12 and locked by a bolt 154. The openings 153 are provided at various locations in the bottom box section 40 in order to enable the mounting of the linkages in a plurality of ways, depending on the positions of the modules and the directions in which the doors open.

Figure 31:
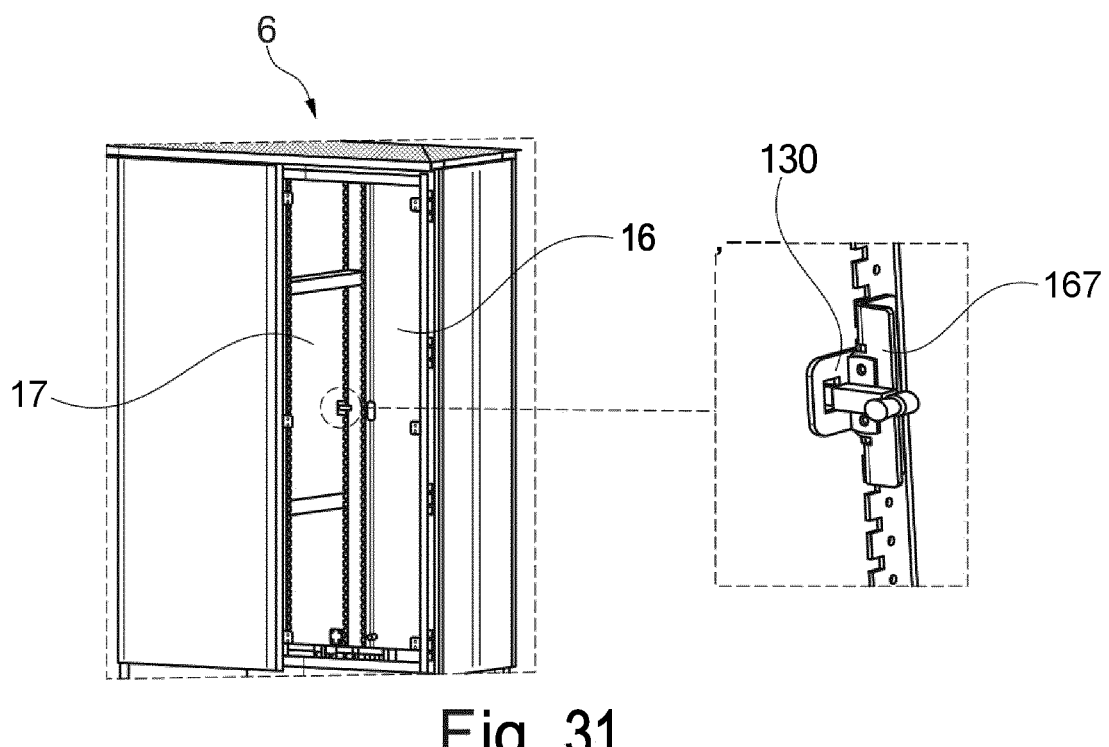
FIG. 31 is a partial and schematic representation of an example of a slam lock situated inside the doors with no lock visible from the outside.

The doors 17 include for example a strike 130, for example at mid-height as depicted in FIG. 31, in which engages for example the bolt of a slam lock 167 fixed to the rail 41 of the corresponding frame 12.

To open the door 16 the first step is to actuate the lock 100 using the corresponding key.

Then, once the door 16 is open, the locking bars 152 are removed and the levers 155 actuated to move the links 156 and the locking tongues 158.

The locks 130 can then be actuated to open the doors 17.

Of course, the invention is not limited to the examples that have just been described.

For example, the equipment received by the modular structure 6 or carried by the mast 3 is not limited to that mentioned. Any equipment liable to be integrated in an urban environment and fitted to the element 1 may be envisaged, in particular connected equipment enabling contribution to establishing a "smart city".

The mast 2 may be fixed to the support module 3 in any manner ensuring the stability and the verticality of the mast.

The frame may be enclosed in various ways. For example, the panels need not be made of metal and at least some of them may be replaced by electronic display panels, for example of OLED type.

The invention claimed is:

1. An infrastructure element including:
a mast configured to receive at least one telecommunication antenna,
at least one support module closed at a top thereof and configured to receive electrical equipment internally and permanently, the mast being fixed to the support module without passing vertically therethrough, the support module comprising four support columns fixed to a base and held in an upper part thereof by an upper panel having a support plate fixed thereto and onto which the mast is fixed, the support columns being joined on at least two lateral sides of the support module by bracing struts, and
at least one non-supporting accessory module configured to receive the electrical equipment, the accessory module being assembled laterally to the support module.

2. The element claimed in claim 1, wherein at least one of:
the support module having a parallelepipedal shape and including a framework with the four support columns,
the mast having a height between 4 and 10 meters and a section with a diameter between 80 mm and 350 mm,
the support module including at least one vertical enclosure panel, or
the support module including at least one vertical enclosure panel and at least one door with dimensions substantially identical to those of the enclosure panel.

3. The element claimed in claim 1, wherein at least one of:

the support module and said at least one accessory module being assembled by bolting together, or the support module and said at least one accessory module exhibiting a continuity of front panel in assembly thereof.

4. The element claimed in claim 1, wherein at least one of:

at least one of the accessory modules being a single module having dimensions substantially identical to those of the support module, at least one of the accessory modules being a module having dimensions different from those of the support module, or at least one of the accessory modules being a module having dimensions different from those of the support module and the element including a lateral assembly of a respective said support module with one or more accessory modules, the assembly being chosen from: a double module assembled on one side of the support module, a single module assembled on one side of the support module, a double module and a single module assembled on respective opposite sides of the support module.

5. The element claimed in claim 1, wherein at least one of:

the support module and said at least one accessory module each defining an internal volume able to receive electrical equipment, the internal volumes of two modules assembled side-by-side communicating with each other, or said at least one accessory module and said support module each including at least one enclosure panel, the enclosure panels being identical.

6. The element claimed in claim 1, wherein at least one of:

said at least one accessory module including at least one door identical to at least one door of the support module, or the support module including the support plate onto which the mast is fixed, seating of this plate being adjustable relative to a remainder of the support module.

7. The element claimed in claim 1, wherein at least one of:

the support module or the accessory module(s) receiving equipment fixed in electrical cabinets or racks present inside the support module or accessory modules, or the support module or said at least one accessory module being pre-equipped with ducts, gutters, rails, or electrical cable guides.

8. The element claimed in claim 1, wherein the equipment received in the support module or said at least one accessory module or fixed to the mast at least one of:

having telecommunication functionalities, the equipment being adapted to be connected to the antenna carried by the mast, having electrical power supply functionalities, or being video servers or cameras, lighting, connected racks, GPS antennas or other location systems or sensors configured for urban use.

9. The element claimed in claim 1, further including a concrete block onto which at least the support module is fixed, or wherein at least one of:

the element including a roof covering at least part of the support module, the support module including a deck, the roof being supported at a distance from the deck of the support module, or the element including a roof covering at least part of the support module, the support module including a deck, the roof being supported at a distance from the deck of the support module and the roof being modular with a module having an opening for the mast to pass through.

* * * * *